(12) United States Patent
Mizushima et al.

(10) Patent No.: US 6,362,511 B1
(45) Date of Patent: Mar. 26, 2002

(54) MIS-TYPE SEMICONDUCTOR DEVICE HAVING A MULTI-PORTION GATE ELECTRODE

(75) Inventors: Ichiro Mizushima, Yokohama; Mariko Takagi, Kawasaki, both of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/388,939

(22) Filed: Sep. 2, 1999

(30) Foreign Application Priority Data

Sep. 4, 1998 (JP) .......................... 10-265793
Aug. 27, 1999 (JP) .......................... 11-242208

(51) Int. Cl.[7] .............................. H01L 21/76
(52) U.S. Cl. ........................ 257/412; 257/413
(58) Field of Search ................. 438/592, 199, 438/585, 587, 588; 257/412, 413, 369

(56) References Cited

U.S. PATENT DOCUMENTS 5,441,904 A * 8/1995 Kim et al. .................. 438/592
5,652,156 A * 7/1997 Liao et al. .................. 438/162
5,767,004 A * 6/1998 Balasubramanian et al. .......................... 438/592
5,786,027 A * 7/1998 Rolfson ....................... 427/124

FOREIGN PATENT DOCUMENTS

GB  2254960 A  * 10/1992
JP  2-298074    12/1990

OTHER PUBLICATIONS

H. Ito et al.; "Gate Electrode Microstructure Having Stacked Large–grain Poly–Si with Ultra–thin $SiO_x$ Interlayer for Reliability in Sub–micrometer CMOS"; IEDM 97; pp. 635–638.

* cited by examiner

Primary Examiner—Olik Chaudhuri
Assistant Examiner—Hoai Pham
(74) Attorney, Agent, or Firm—Finnegan, Henderson, Farbow, Garrett & Dunner, L.L.P.

(57) ABSTRACT

In A MIS type semiconductor device using a polycrystalline silicon film as a gate electrode, a lower portion of the polycrystalline silicon film has larger grains in average diameter than an upper portion thereof, and there is no peak of oxygen concentration in a film thickness direction in the polycrystalline silicon film.

14 Claims, 16 Drawing Sheets

BEFORE INTERLAYER FILM FORMATION STEP

AFTER COMPLETION OF FINAL STEP

MIS-TYPE SEMICONDUCTOR DEVICE HAVING A MULTI-PORTION GATE ELECTRODE

BACKGROUND OF THE INVENTION

In the first place, a general process for manufacturing a MOS type integrated circuit, and more specifically, a process for manufacturing a CMOS-type integrated circuit will be explained with reference to FIGS. 22A–22E.

As shown in FIG. 22A, a device isolation insulating film 102, an n-well 103 and a p-well 104 are first formed in a silicon substrate 101.

Then, as shown in FIG. 22B, after a gate insulating film 105 is formed, a polycrystalline silicon film is deposited over the entire surface. Subsequently, the resultant structure is processed by optical lithography and anisotropic etching to form a gate electrode.

In general, the polycrystalline silicon film thus formed is constituted of columnar polycrystalline silicon having an average grain diameter of several tens nm, as viewed from above. In such a columnar polycrystalline silicon film, numerous small crystal grains are present at the interface with the gate oxide film 105, as shown in FIG. 22C. The sizes of the crystal grains increase as they go away from the interface.

As shown in FIG. 22D, to prevent an electric field from being converged at an edge of the gate electrode 106, a post-oxidation film 107 is formed. Furthermore, impurity ions are doped at a level on the order of $1\times10^{13}$–$10^{14}$/cm$^2$ in the surface of the silicon substrate 101 by means of ion implantation. In this case, As$^+$ or P$^+$ is doped in an nMOSFET region and B$^+$ or BF$_2^+$ is doped in a pMOSFET region. In this manner, a so-called LDD region 108 (recently, sometimes called an "extension region") is formed.

Then, as shown in FIG. 22E, a silicon nitride film or a silicon oxide film is deposited over the entire surface by a CVD method. The resultant structure is etch-backed to form a side-wall insulating film 109 on a side wall of the gate electrode 106.

Furthermore, As$^+$ or P$^+$ is doped in the nMOSFET region and B$^+$ or BF$_2^+$ is doped in the pMOSFET region at a level on the order of $10^{15}$/cm$^2$. After doped simultaneously in a source/drain region 110 and the gate electrode 106 as mentioned above, the impurity ions are electrically activated by high-temperature annealing such as RTA (Rapid Thermal Anneal).

Furthermore, for example, a CoSi$_2$ film 111 is formed on the source/drain region 110 and the gate electrode 106 to reduce resistance of the source/drain region 110 and the gate electrode 106.

Thereafter, the resultant structure is subjected to usually-performed processes including an interlayer insulating film formation step, a metal wiring formation step, and a passivation film formation step. In this way, an LSI (not shown) is accomplished.

However, in the case where high integration and high performance of LSI are attained by using the aforementioned conventional techniques, the following problems are arisen.

The high integration and high performance of LSI are basically attained by reducing a gate channel length. However, it is not preferable to merely reduce the gate channel length since distribution of the electric field within the MOSFET is significantly changed, causing significant reduction in threshold voltage (short channel effect) and a reduction in punch-through voltage between the source and drain.

Accordingly, in practice, as the gate channel length is reduced, the gate insulating film and the depth of source/drain junction must be reduced in order to distribute the electric field almost uniformly within the MOSFET.

The source/drain junction depth can be generally reduced by suppressing the projection range by reducing the acceleration energy during the ion implantation and by performing the post annealing for a necessary and minimum time period. Since the impurity ions must be activated, a high-temperature/short-time annealing method, RTA, is generally performed after the ion implantation step. However, the junction depth has been shallower in recent years. In accordance with this tendency, the temperature and time of RTA have been reduced.

In these circumstances, a depletion phenomenon of the gate electrode has lately become a great matter of concern. The depletion phenomenon takes place when an energy band is bent at the interface between the gate electrode and the gate oxidation film and thereby a depletion layer is elongated (depletion). The depletion of the gate electrode is a phenomenon remarkably occurring when a density of electrically active impurity ions contained in the gate electrode near the interface with the gate oxidation film is low.

The depletion of the gate electrode is equivalent of reducing an effective capacitance of the gate oxide film, in other words, equivalent of increasing an effective film thickness of the gate oxide film.

The driving force for MOSFET can be expressed by a product of an activated carrier concentration and a carrier velocity. The activated carrier concentration is determined depending upon the effective capacitance of the gate oxidation film. Therefore, if the gate depletion occurs, the activated carrier concentration decreases. This directly means that the MOSFET driving force decreases.

The depletion of the gate electrode often and easily takes place when the gate electrode is formed of columnar polycrystalline silicon film and impurity ions are doped in the source/drain region and the gate electrode. This is because the impurity ions of the gate electrode are insufficiently activated since the annealing is performed at lower-temperature for shorter time, as the junction depth is reduced.

The reason why the impurity ions of the gate electrode are insufficiently activated, is as follows. Since the gate electrode is formed of the polycrystalline silicon film, grain boundaries are present in the gate electrode. The impurity ions of the gate electrode are usually segregated and inactivated in the grain boundary. The segregation/inactivation occurs more significantly as the temperature decreases. As a result, the impurity ions in the gate electrode are insufficiently activated as the temperature and time for the annealing are decreased, compared to that in the source/drain region.

Besides a lower activation rate at a certain temperature, there are another problem in that if later subjected to a step performed at 600 to 800° C. (e.g., interlayer insulating film deposition step), impurity ions once activated in the crystal grains are diffused to the grain boundary and then segregated and inactivated.

In fact, it has been experimentally confirmed that the depletion rate significantly changes when the gate electrode taken after completion of the interlayer film deposition step is compared to that taken after completion of the final step, as shown in FIG. 23.

The segregation/inactivation readily occurs as the crystal grain is reduced in diameter and the grain boundary increased in number. Therefore, in the case, for example, a conventional case, where the columnar polycrystalline silicon film is used as the gate electrode, the number of the grain boundary increases near the interface between the gate electrode and the gate oxide film. As a result, in particular, the aforementioned segregation/inactivation problem easily occurs.

As is clear from the foregoing discussion, to solve the inactivation problem of impurity ions present in the gate electrode, it is better to increase the diameters of the crystal grains constituting the gate electrode (polycrystalline silicon film) because the grain boundary in the gate electrode reduces. However, the use of the polycrystalline silicon film having large-diameter grains (large-grain polycrystalline silicon film) produces the following new problems.

In general, the large-grain polycrystalline silicon film is formed by re-crystallization of an amorphous silicon film. However, in the recrystallization method, a single crystal is formed in the depth direction of the film, so that individual crystal planes differ in orientation (crystal axes), as shown in FIG. 24.

When impurity ions are doped by ion implantation into the gate electrode (large-grain polycrystalline silicon film) constituted of grains whose planes different in orientation, the depths of the doped impurity ions varies since a channeling rate differs depending upon the crystal plane orientation. If the depth of impurity ions differs, the threshold voltage of a MOSFET varies.

In addition, as a result that a channeling rate differs depending upon the plane orientation, the impurity ions doped into the gate electrode sometimes reach the silicon substrate. In this case, the threshold voltage of the MOSFET is extremely decreased.

Incidentally, as the gate electrode made of silicon, a dual-layered structure is known (H. Ito et al., "Gate electrode microstructure having stacked large-grain poly-Si with ultra-thin SiOx interlayer for Reliability in Sub-micro meter CMOS", IEDM 97, p635–638).

In this case, the gate electrode is obtained by forming a polycrystalline silicon film having large-diameter grains (large-grain polycrystalline silicon film), a thin insulating film (e.g., a thin oxide film such as native oxide film), and a polycrystalline silicon film having small diameter grains (small-grain polycrystalline silicon film) on the gate insulating film in sequential order.

The reason why the small-grain polycrystalline silicon film is formed on the large-grain polycrystalline silicon film with the thin insulating film interposed therebetween is to prevent the small grain polycrystalline silicon film from being formed under the influence of the crystallinity of the underlying small grain polycrystalline silicon film.

BRIEF SUMMARY OF THE INVENTION

The present inventors consider that the MOSFET employing a conventional double-layered gate electrode has the following problems. The double-layered gate electrode has a thin insulating film between the large-grain polycrystalline silicon film and the small-grain polycrystalline silicon film functions as a resistant component. Therefore, the high frequency property of the MOSFET using the double layered gate electrode is degraded.

Furthermore, such a MOSFET has processing problems as set forth below. The double-layered gate electrode is formed by sequentially forming the large-grain polycrystalline silicon film, a thin insulating film, and thereafter, the small-grain polycrystalline silicon film and etching them in a retrograde order.

In this case, first, the etching between large and small grain poly-Si film in the published pager conditions for the thin insulating film are equal to the etching conditions for the gate oxide film. Second, the film thickness of the large-grain polycrystalline silicon film and the small-grain polycrystalline silicon film is reduced as the miniaturization of a device. Third, etching conditions for such a thin large-grain polycrystalline silicon film and the small-grain polycrystalline silicon film are not sufficiently controlled by present techniques. For these three reasons, the silicon substrate is also etched during the etching for the gate electrode formation process. As a result, parasitic resistance is increased and the characteristics of the MOSFET are degraded.

The present invention is attained to overcome the aforementioned conventional problems. An object of the present invention is to provide A MIS type semiconductor device and a method of manufacturing the MIS type semiconductor device which can suppress depletion of the gate electrode and channeling of impurity ions and simultaneously overcome degradation of the high frequency properties and problems associated with gate electrode processing time.

The MIS type semiconductor device according to the present invention comprises
  a semiconductor substrate;
  a gate insulating film formed on the semiconductor substrate; and
  a gate electrode formed on the gate insulating film and formed of a polycrystalline silicon film.

The grains of a lower portion of the polycrystalline silicon film are larger in average diameter than the grain of an upper portion thereof. There is no peak in oxygen concentration in the film thickness direction in the polycrystalline silicon film.

According to the present invention, the lower portion of the polycrystalline silicon film is formed of the large-grain polycrystalline silicon. It is therefore possible to suppress fluctuation in threshold voltage caused by channeling during ion implantation. Furthermore, the upper portion of the polycrystalline silicon film is formed of the small-grain polycrystalline silicon. It is therefore possible to suppress depletion of the gate electrode caused by segregation/inactivation of the impurity ions in the grain boundary.

There is no peak in oxygen concentration in the polycrystalline silicon film. In other words, no oxide film is present in the region in which grain diameter of the polycrystalline silicon changes. It is therefore possible to overcome deterioration in high frequency properties and difficulty in etching during the gate electrode processing.

The average diameter of the polycrystalline silicon grains is obtained by dividing the length of a cross line, which is formed between a plane in parallel to the substrate and a plane in perpendicular to the substrate, by the number of the grain boundaries present on the cross line.

In another MIS-type semiconductor device according to the present invention comprises
  a semiconductor substrate;
  a gate insulating film formed on the semiconductor substrate; and
  a gate electrode formed on the gate insulating film and formed of a polycrystalline silicon film,
    in which a lower portion of the polycrystalline silicon film has larger grains in average diameter than an upper portion thereof; and a region in which the average grain diameter of the polycrystalline silicon film changes is set at a distance of 1 nm apart from an interface between the gate electrode and the gate insulating film.

According to the present invention, a region in which the average grain diameter of the polycrystalline silicon film changes is set at a distance of 1 nm apart from an interface between the gate electrode and the gate insulating film. It is therefore possible to effectively suppress depletion of the gate electrode. We will further describe with respect to this point in detail in embodiments.

In still another MIS-type semiconductor device according to the present invention comprises
- a semiconductor substrate;
- a gate insulating film formed on the semiconductor substrate;
- a gate electrode formed on the gate insulating film and formed of a polycrystalline silicon film; and
- two source/drain regions formed in a surface of the semiconductor substrate so as to sandwich the gate electrode,
  - in which a lower portion of the polycrystalline silicon film has larger grains in average diameter than an upper portion thereof, and a distance between a portion of the polycrystalline silicon film, at which the average grain diameter is changed, and an upper surface of the polycrystalline silicon film, is larger than a distance between a portion of the source drain regions having a peak impurity concentration and a surface of the semiconductor substrate.

According to the present invention, a distance between a interface in the polycrystalline silicon film, at which the average grain diameter is changed, and an upper surface of the polycrystalline silicon film, is larger than a depth of a peak impurity concentration of source/drain region measured from surface of the semiconductor substrate. It is therefore possible to efficiently suppress a problem of channeling of impurity. We will further describe this point in embodiments.

A method of manufacturing a semiconductor device according to the present invention comprises the steps of:
- forming a gate insulating film on a semiconductor substrate;
- forming a polycrystalline silicon film on the gate insulating film without exposing the semiconductor substrate to an air while film formation conditions are changed between a first half step and a latter half step of a film formation process; and
- forming a gate electrode by processing the polycrystalline silicon film.

According to the present invention, the film formation process is changed between a first half process and a latter half process without exposing a semiconductor substrate to the air. It is therefore possible to form a polycrystalline silicon film, a lower portion of which has grains larger in average diameter than that of an upper portion, and which has no peak in oxygen concentration in a film-depth direction. We will describe as to this point in embodiments.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Now, embodiments of the present invention will be explained with reference to the accompanying drawings.

Figure 1A:
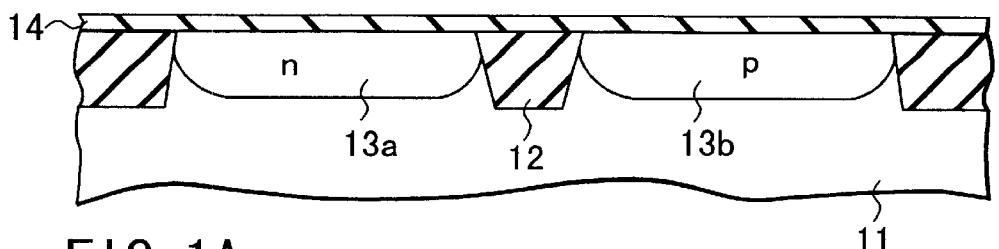
FIGS. 1A to 1C are views showing a method of manufacturing a semiconductor device having a CMOS structure according to a first embodiment of the present invention.

As shown in FIG. 1A, an n-well 13a, a p-well 13b, and a device isolation insulating film 12 are formed in a silicon substrate 11 by well-known methods including a well-formation method and an isolation method such as Shallow Trench Isolation (STI). Thereafter, a gate insulating film (silicon oxide film) 14 is formed.

Subsequently, an un-doped amorphous silicon film is deposited over the entire surface in a thickness of 40 nm by a CVD method. As a source gas, a gas mixture of silane ($SiH_4$) and hydrogen is used. A flow rate of silane is 0.5 slm, and a film deposition temperature is 550° C.

Figure 1B:
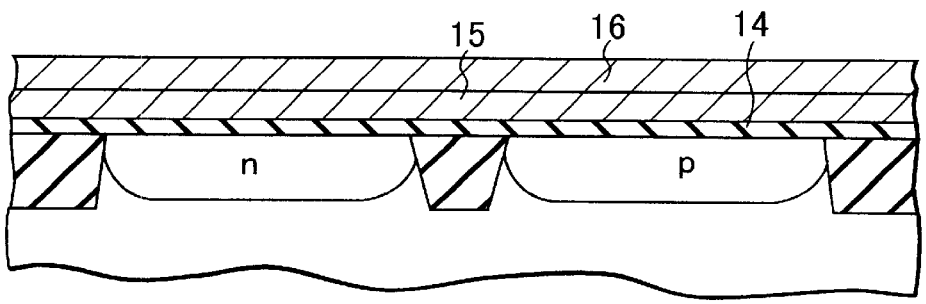

As shown in FIG. 1B, the amorphous silicon film is converted into a polycrystalline silicon film 15 by changing the atmosphere from the silane/hydrogen gas mixture to hydrogen gas alone and increasing a deposition temperature up to 700° C.

Subsequently, as shown in FIG. 1B, a polycrystalline silicon film 16 of 40 nm thick is deposited on the polycrystalline silicon film 15 by supplying silane at a flow rate of 0.9 slm while the deposition temperature is maintained at 700° C. The steps from the amorphous silicon film formation to the polycrystalline silicon film (16) formation step are performed in the same vacuum chamber without exposing to the atmosphere.

Figure 2:
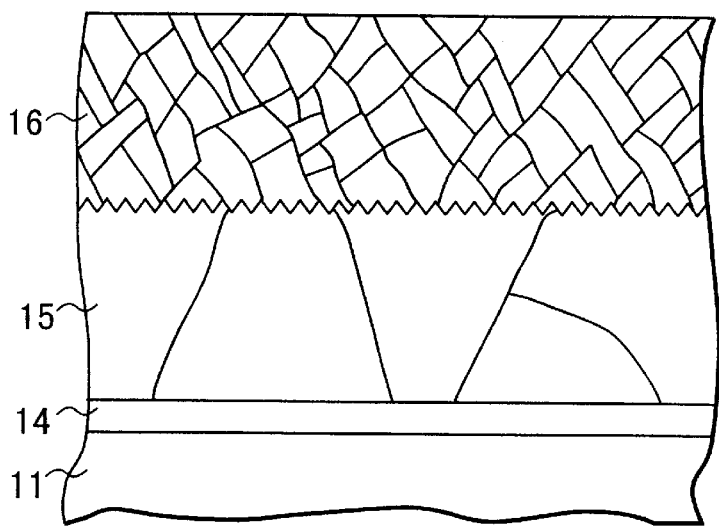
FIG. 2 is a schematic view showing a structure of a polycrystalline silicon film according to the present invention.

The crystallization state of the polycrystalline silicon films 15, 16 thus obtained is investigated. As a result, it was found that the upper polycrystalline silicon film 16 and the lower polycrystalline silicon film 15 completely differ in crystallinity, as schematically shown in FIG. 2.

The polycrystalline silicon film 15, which is obtained by converting the silicon film of an amorphous state into a polycrystalline state, has crystal grains of 1 μm or more in diameter, whereas the polycrystalline silicon film 16 of a polycrystalline state from the beginning, has crystal grains of 10 nm or less in diameter. In this case, twins in a grain are regarded as a grain boundary.

Figure 1C:
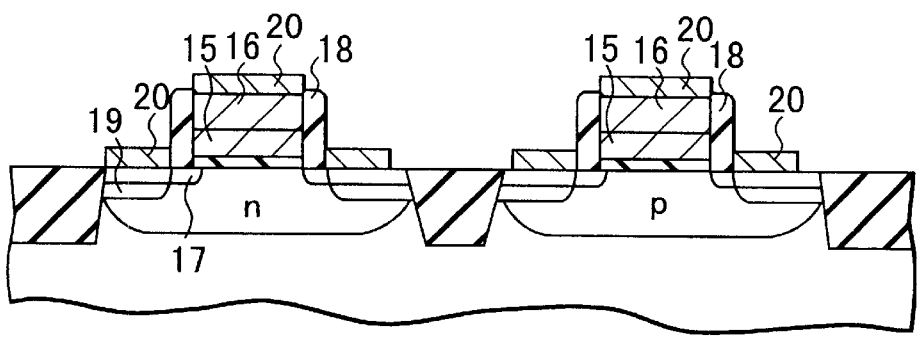

As shown in FIG. 1C, after the polycrystalline silicon films 15 and 16 are processed into a gate electrode form, ions are doped into each of an nMOS region and a pMOS region to form an extension region 17.

Then, as shown in FIG. 1C, a side wall insulating film 18 is formed on side walls of the gate electrodes 15 and 16. The side wall insulating film 18 is formed by depositing a silicon oxide film (5 nm thick) and a silicon nitride film (40 nm thick) successively over the entire surface, followed by applying anisotropic-etching to these insulating films. In this embodiment, a layered insulating film is used as the side wall insulating film 18. However, a single-layer insulating film may be used.

Subsequently, impurities are doped simultaneously to the nMOS and the pMOS regions to reduce resistance of the gate electrodes 15 and 16 and to form a source/drain region 19. $As^+$ and $B^+$ are implanted into the nMOS region and the pMOS region, respectively. $As^+$ is implanted under the conditions of 30 keV and $4 \times 10^{15}$ $cm^{-2}$. $B^+$ is implanted under the conditions of 3 keV and $4 \times 10^{15}$ $cm^{-2}$. Electrical activation of the impurities was performed by the annealing using RTA at 950° C. for 10 seconds.

After a Co film (5 nm thick) and a TiN film (7 nm thick) are subsequently deposited over the entire surface by a sputtering method, annealing is performed in a nitrogen ambient at 500° C. for 30 seconds to thereby form a cobalt monosilicide (CoSi) film.

After the TiN film and the unreacted Co film are removed, annealing is performed at 700° C. for 30 seconds. In this manner, a cobalt disilicide ($CoSi_2$) film 20 is formed on the gate electrodes 15 and 16 as well as on the source/drain region 19, as shown in FIG. 1C. Thereafter, according to a well-known method, an inter-layer insulating film and metal wiring (not shown) are formed. In this manner, a CMOS structure is achieved.

Figure 3A:
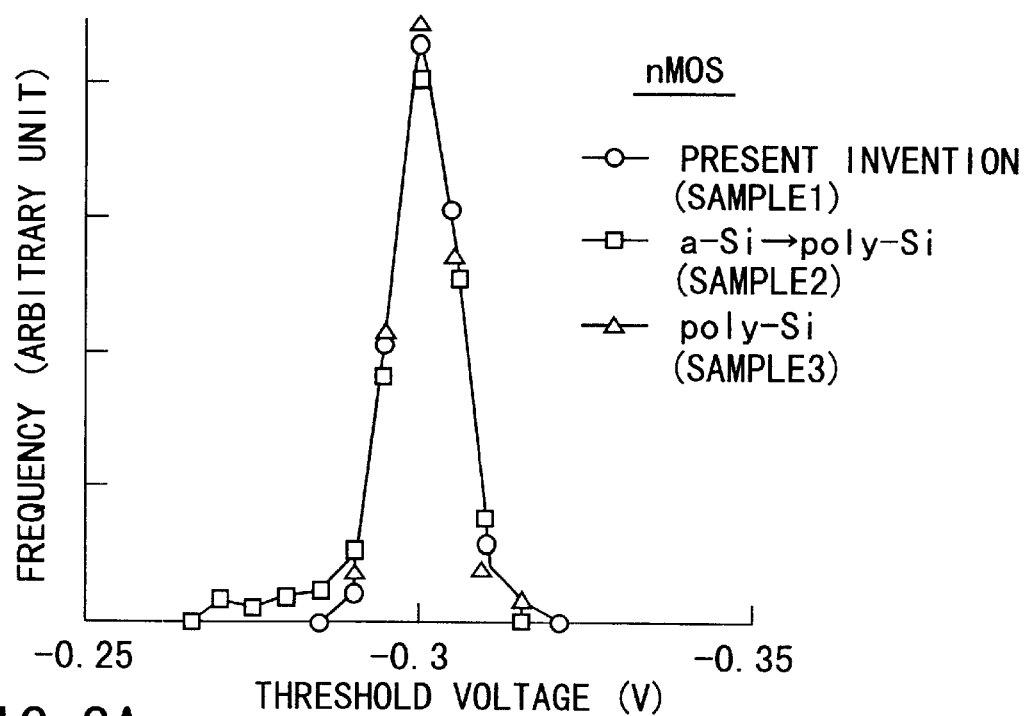
FIGS. 3A and 3B are graphs showing that threshold voltage varies depending upon difference in structure of the polycrystalline silicon film.
Figure 3B:
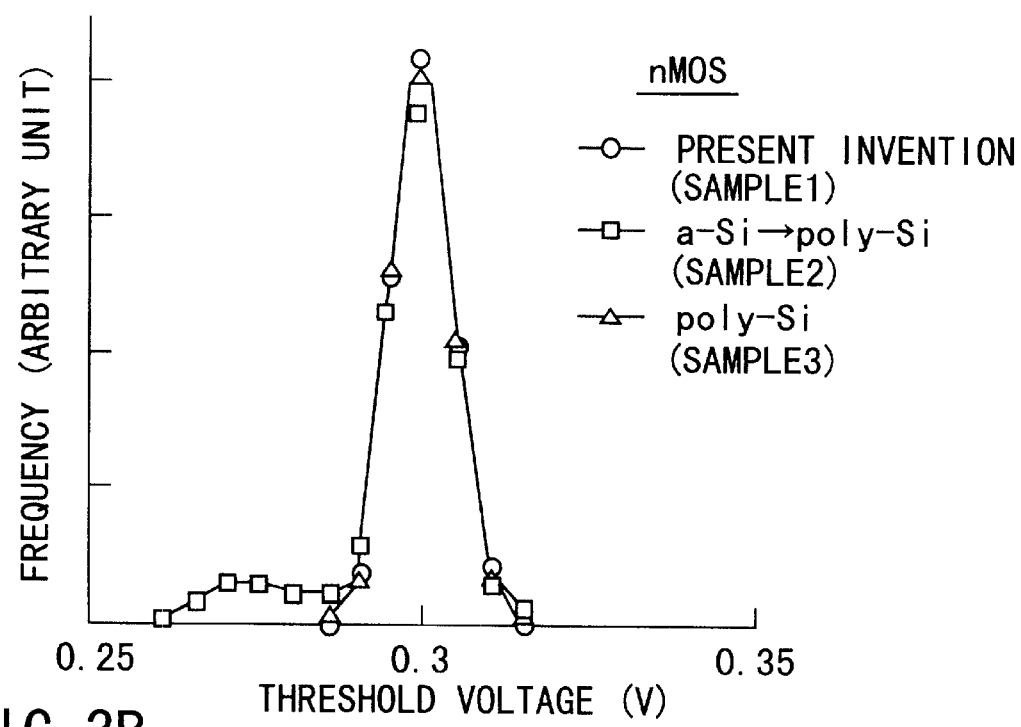
Figure 4:
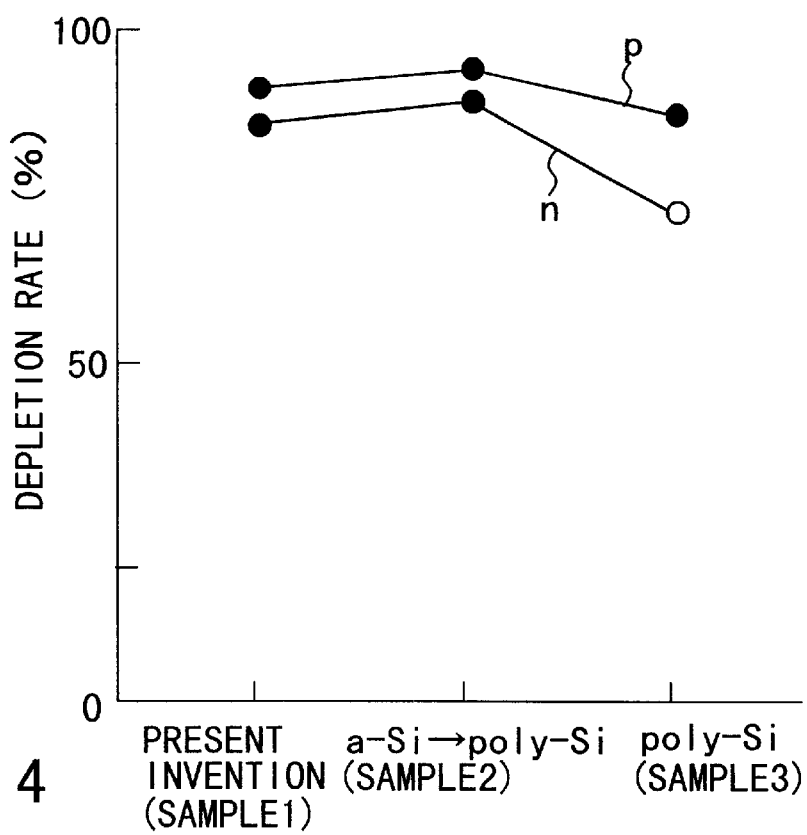
FIG. 4 is a graph showing that a depletion rate varies depending upon difference in structure of the polycrystalline silicon film.

A threshold voltage and variations thereof are measured for the transistor (Sample 1) manufactured in the aforementioned method. The results are shown in FIGS. 3A and 3B. To determine a degree of depletion, CV is measured. The results are shown in FIG. 4.

For comparison, the same measurement is performed with respect to Samples 2 and 3. Sample 2 employs a single-layered polycrystalline silicon film as a gate electrode prepared by first forming an amorphous silicon film and then converting it into the polycrystalline silicon film. Sample 3 employs the single layered polycrystalline silicon film prepared in a polycrystalline state from the beginning, as a gate electrode. These measurement results are also shown in FIGS. 3A and 3B and FIG. 4.

From FIGS. 3A and 3B, it is found that, in the case of Sample 1, which employs a double-layered gate electrode constituted of a large-grain polycrystalline silicon film and a small-grain polycrystalline silicon film, an average of threshold voltages of an nMOS or a pMOS is about 0.3 V and variations thereof are small.

From FIGS. 3A and 3B, it is found that, in the case of Sample 2, which employs a single-layered polycrystalline silicon film converted from an amorphous silicon film, as a gate electrode, shows the same average threshold voltage but there are many low threshold voltage values.

Furthermore, from FIGS. 3A and 3B, it is found that there is no significant difference in the average value and variation of the threshold voltages between Sample 1 (present invention) and Sample 3, which employs a single-layered polycrystalline silicon film formed in a polycrystalline state in the beginning, as a gate electrode.

Furthermore, from the measurement results with respect to the depletion rate shown in FIG. 4, it is found that Sample 3 (using the polycrystalline single layered silicon film from the beginning, as a gate electrode) exhibits a low depletion rate.

The reason why the threshold voltage and the depletion rate varies depending upon different manufacturing methods for the gate electrode as described above, can be interpreted as follows.

When the polycrystalline single-layered silicon film converted from an amorphous silicon film is used as a gate electrode, the gate electrode becomes a large-grain polycrystalline single-layered silicon film by the time impurities are doped to reduce the resistance of the gate electrode and to form the source/drain region.

Due to this, channeling occurs in a part of the transistors during the ion implantation. Impurity ions are doped also into the channel region. As a result, it is considered that the threshold voltage is reduced in the part of the transistors.

Figure 5:
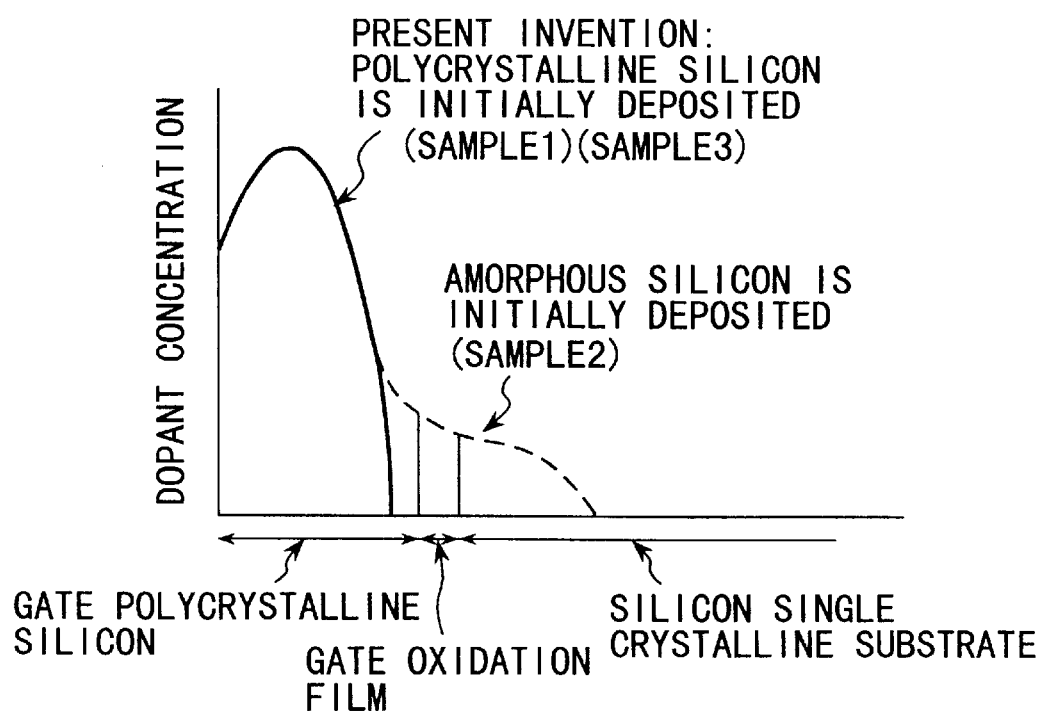
FIG. 5 is a graph showing that a distribution of dopant varies depending upon difference in structure of the polycrystalline silicon film.

Actually, a depth profile with respect to $B^+$ and $As^+$ is checked by SIMS analysis immediately after they are implanted. As a result, the number of ions involved in channeling is larger than in the present invention, as shown in FIG. 5.

The reason why the rate of the cells having a low threshold voltage is particularly high in the pMOS is considered as follows. Since $B^+$ is used as an implantation ion in the pMOS, a polycrystalline silicon film is not amorphized during the ion implantation. As a result, it is considered that the rate of ions involved in channeling is increased in the pMOS, compared to the $As^+$-doped nMOS.

The reason why the depletion rate of Sample 3 is low is that when the silicon film in a polysilicon state from the beginning, is deposited, the size of the grain in the film is reduced and the rate of an electrically inactive dopant is increased.

To confirm this, a carrier concentration of the polycrystalline silicon film is determined by Hall measurement with respect to the cases where the gate electrodes are formed in the aforementioned three methods. The results are shown in FIG. 6.

Figure 6:
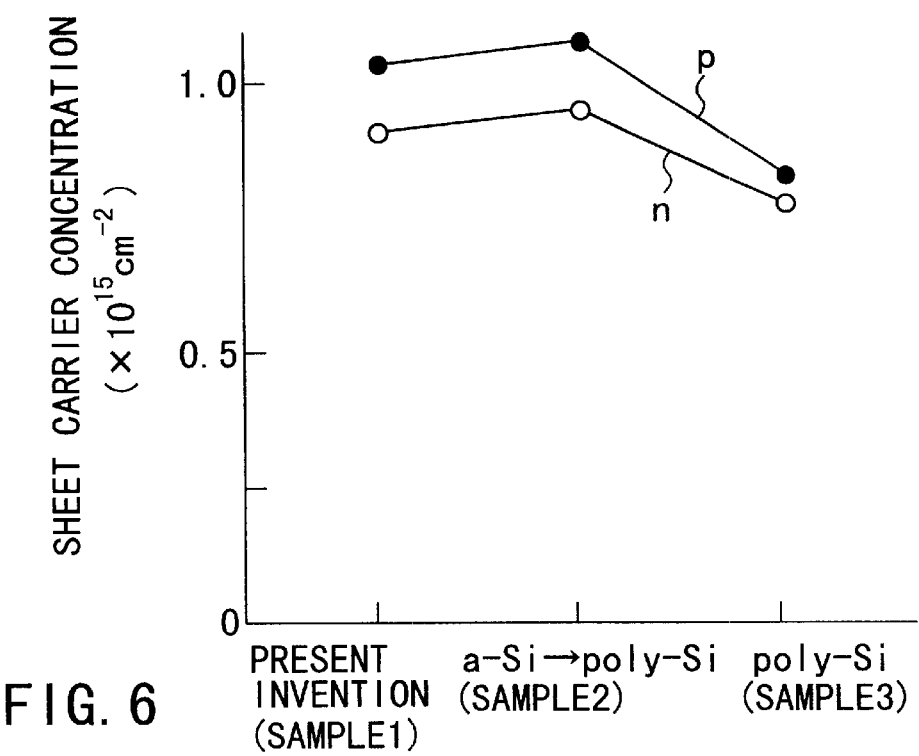
FIG. 6 is a graph showing that a sheet carrier concentration varies depending upon difference in structure of the polycrystalline silicon film.

Form FIG. 6, it is found that a sheet career concentration is low when the polycrystalline silicon film is formed under the conditions at which the silicon film is formed in a polycrystalline state upon depositing. This is because the diameters of crystal grains over the entire film are low and the rate of a dopant segregated in the grain boundary is high. As a result, the depletion comes to easily occur particularly in Sample 2, as shown in FIG. 4.

When the polycrystalline silicon film is formed in accordance with the method of the present invention, the diameters of the crystal grains can be changed so as to form a double layered structure by virtue of the following conceivable mechanism.

For example, as shown in G. Harbake et al., J. Electrochem. Soc. 131, p 675 (1984), if an amorphous silicon film is crystallized by annealing, a polycrystalline silicon film having relatively large grains can be formed.

If the polycrystalline silicon film is formed in the same deposition and crystallization conditions on the crystallized polycrystalline film, the polycrystalline silicon grows under the influence of the crystallinity of the previously-formed polycrystalline silicon film. As a result, the grains of the newly-deposited polycrystalline silicon film on the underling become larger in diameter than those of the underling polycrystalline silicon film. Therefore, it is difficult to form a polycrystalline silicon film containing small crystal grains in only an upper portion, by a well-known technique.

However, when the crystalline state of the deposited film is investigated by varying the deposition conditions in a wide-variety range. As a result, there is a condition at which an upper polycrystalline silicon film having small grains can be formed without an influence from the crystallinity of the underlying polycrystalline silicon film.

Figure 7:
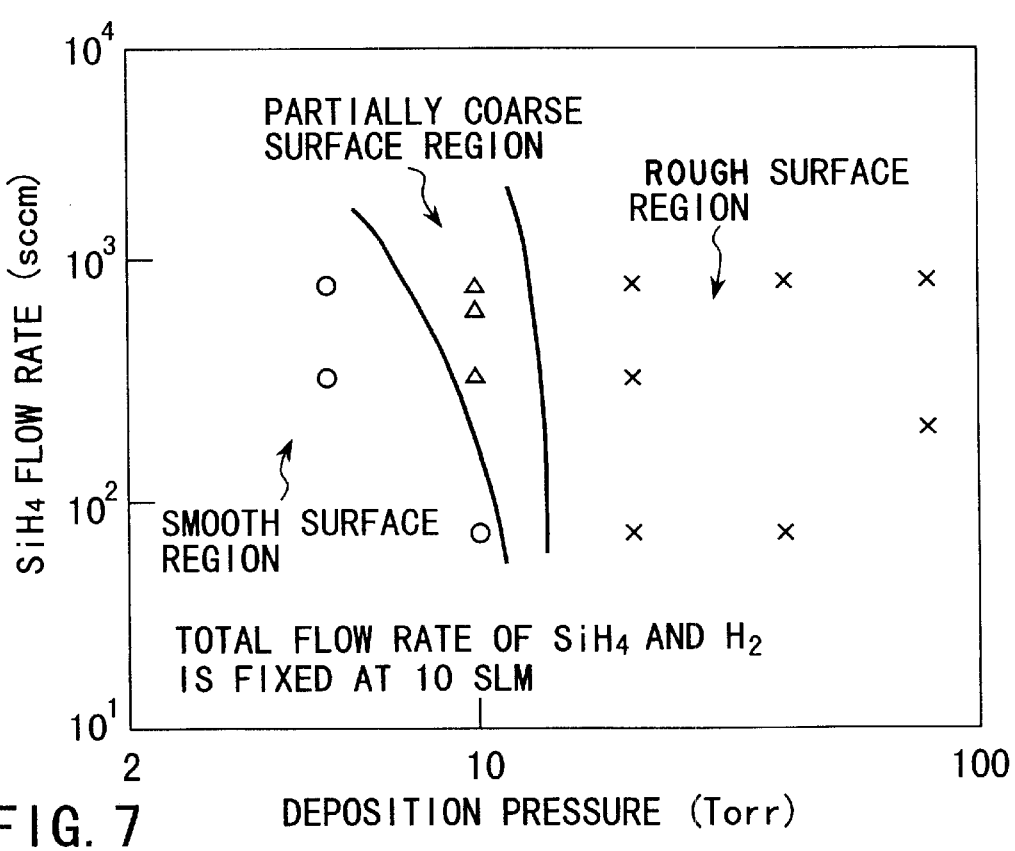
FIG. 7 is a graph showing that a surface morphology of a substrate varies depending upon deposition condition of the polycrystalline silicon film.

FIG. 7 shows the results how to change the surface state of the silicon film when the silicon film is deposited on a single crystalline silicon substrate under several deposition conditions.

Figure 8:
FIG. 8 is a transmission electron microscopy(TEM) image showing a cross sectional structure of the polycrystalline silicon film.
Figure 11A:
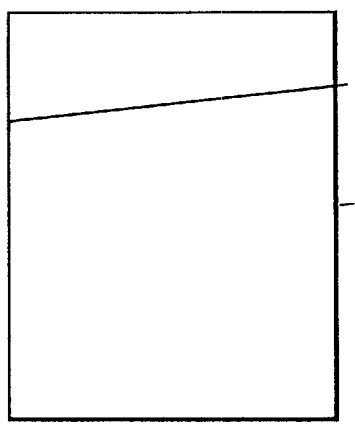
FIGS. 11A to 11C are schematic views showing cross sectional structures of the polycrystalline silicon films shown in FIGS. 8 to 10.

In this experiment, since the single crystalline silicon substrate is used as the underlying layer, if a silicon film is grown under the influence of the crystallinity of the underlying layer, the resultant silicon film inevitably has a flat surface, as shown in a TEM observation image of FIG. 8, which corresponds to "flat surface region" of FIG. 7. To facilitate understanding of FIG. 8, the state of FIG. 8 is schematically shown in FIG. 11A.

Figure 9:
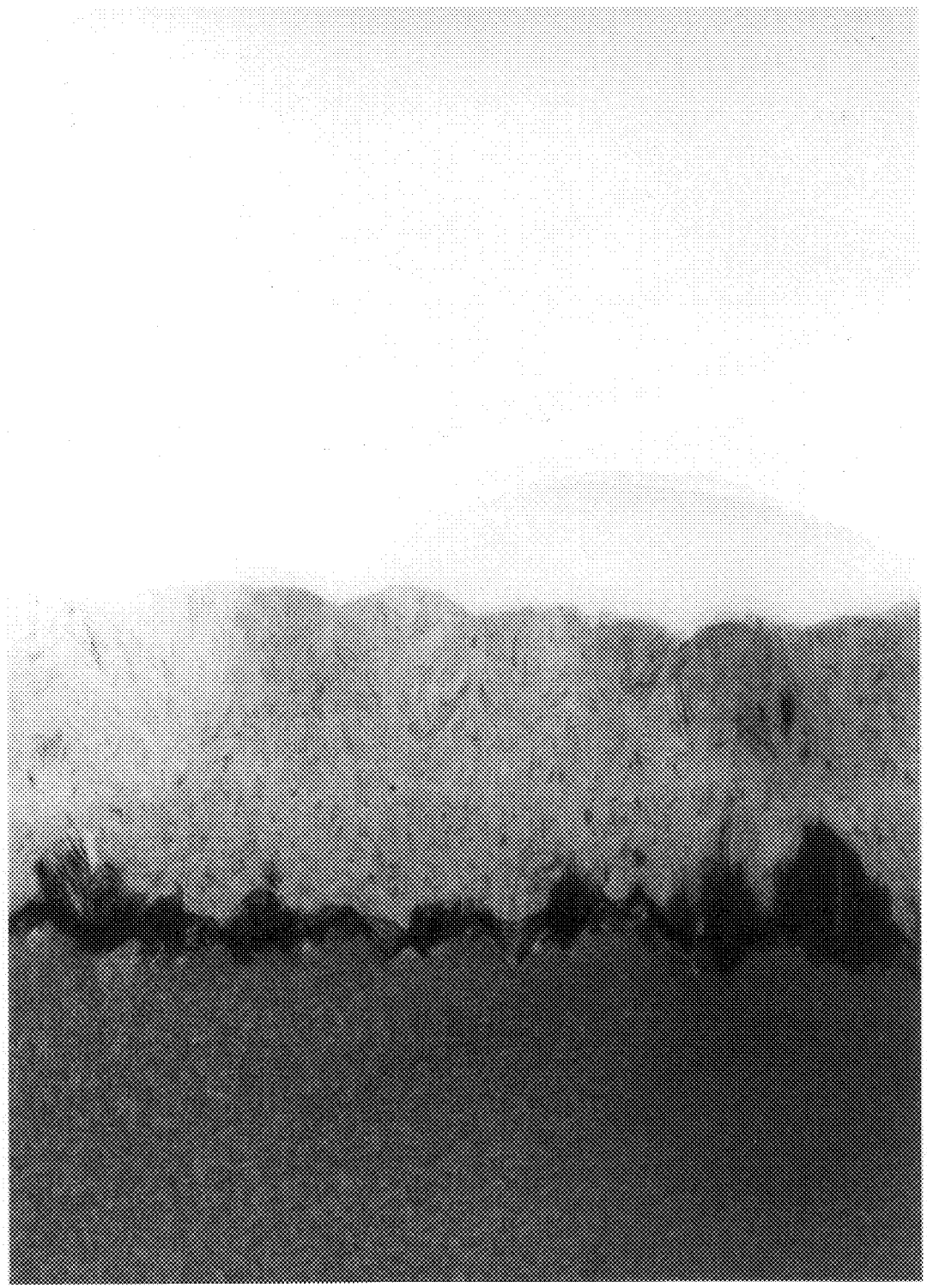
FIG. 9 is a TEM image showing a cross sectional structure of the polycrystalline silicon film.
Figure 11B:
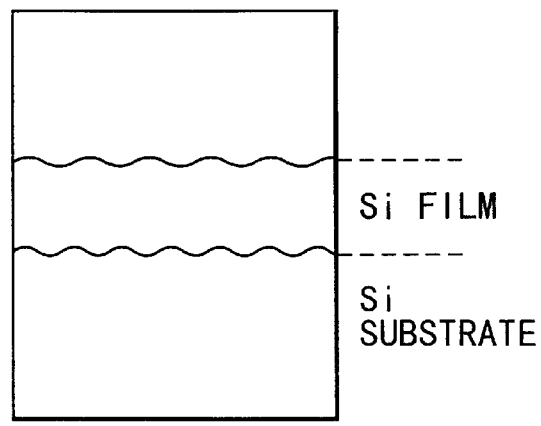

However, depending upon the deposition conditions, the silicon film has a rough surface. In this case, how to grown the crystal is investigated by a cross-section TEM method. As a result, the crystal grains of the silicon film are grown in the polycrystalline state but small in diameter, as shown in a TEM observation image of FIG. 9, which corresponds to "rough surface region" of FIG. 7. To facilitate understanding of FIG. 9, the state of FIG. 9 is schematically shown in FIG. 11B. Therefore, it is found that the silicon film is not epitaxially grown.

This is considered as follows. Usually, when atoms are attached onto a substrate surface during the deposition, they are two-dimensionally diffused on the substrate surface and then deposited at an appropriate site and start growth under the influence of the crystallinity of the underlying layer. However, the atoms are deposited under a relatively high deposition pressure, which is responsible for the rough surface (see FIG. 7), the following atom attaches on the surface of the previously attached atom before the previous atom is deposited at the aforementioned appropriate site. The silicon film thus deposited is therefore formed independently of the underlying crystallinity.

Figure 10:
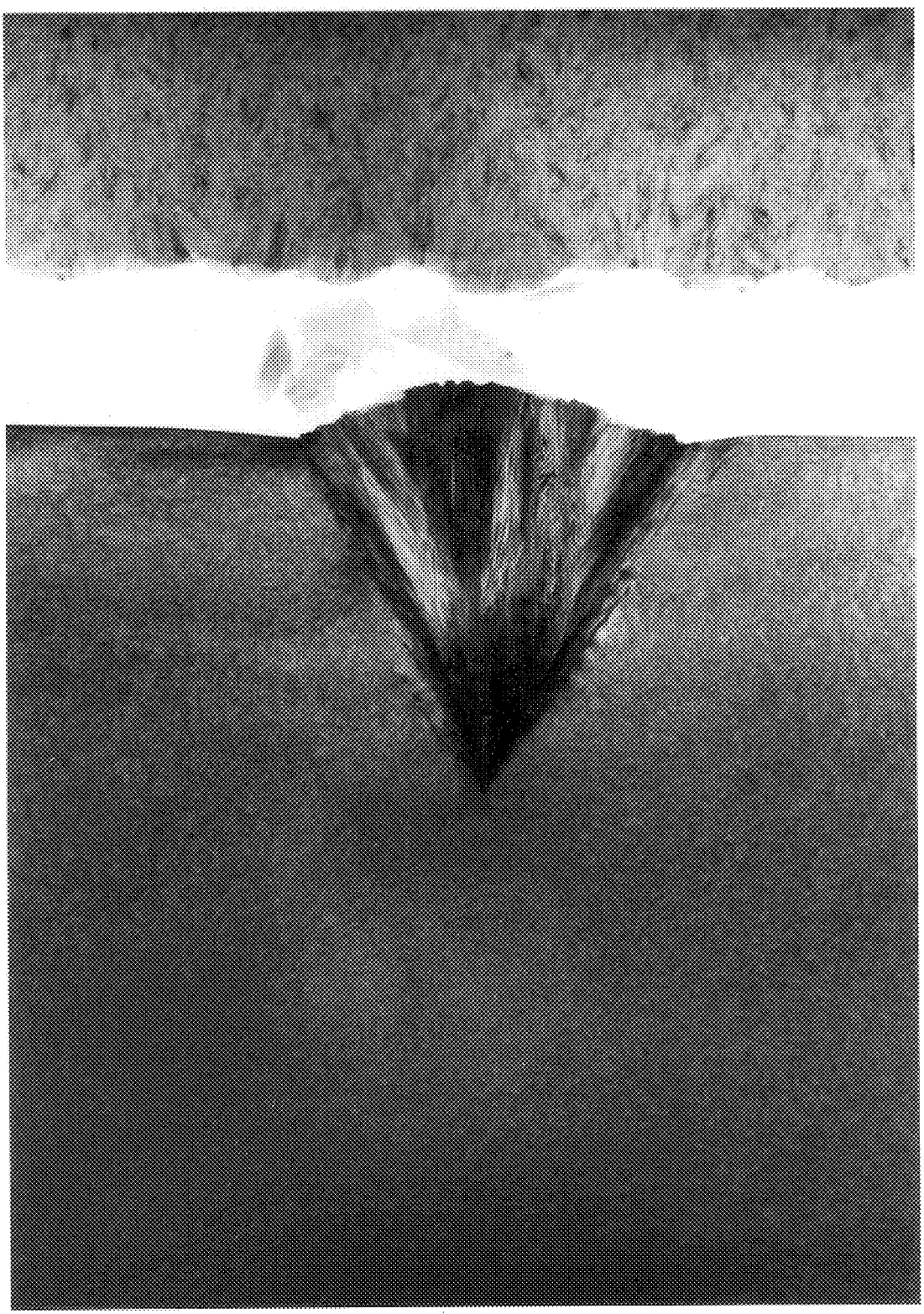
FIG. 10 is a TEM image showing a cross sectional structure of the polycrystalline silicon film.

The results shown in FIG. 7 and cross sectional TEM observation results shown in FIGS. 8–10 are obtained at a silicon film deposition temperature of 700° C. The present invention is not limited to the aforementioned temperature. The same results can be obtained as long as the film deposition is performed in a temperature range of 550° C. to 850° C. The deposition temperature desirably falls in the temperature range of 650 to 750° C.

As mentioned above, the silicon film can be formed under the influence or without the influence of the underling crystallinity depending upon the deposition conditions. By using this phenomenon, it is possible to continuously deposit the polycrystalline silicon films without forming a thin insulating film such as a native oxide therebetween, and to finally form the polycrystalline silicon film having small crystal grains only in the upper portion.

As described in BACKGROUND OF THE INVENTION, the silicon film of the present invention is formed without receiving the influence of the crystallinity of the underlying film by controlling deposition conditions and not by interposing, for example, a native oxide film, between the large-grain polycrystalline silicon film and the small-grain polycrystalline silicon film.

To avoid disadvantages (etching problems) brought by interposing the native oxide film, the large-grain polycrystalline silicon film and the small-grain polycrystalline silicon film are continuously formed without exposing to the air in this embodiment.

Accordingly, in this embodiment, no oxygen and nitrogen, which are adsorbed by exposing the polycrystalline silicon film to the air, are not present between as well as within the large-grain polycrystalline silicon film and the small-grain polycrystalline silicon film.

Figure 12:
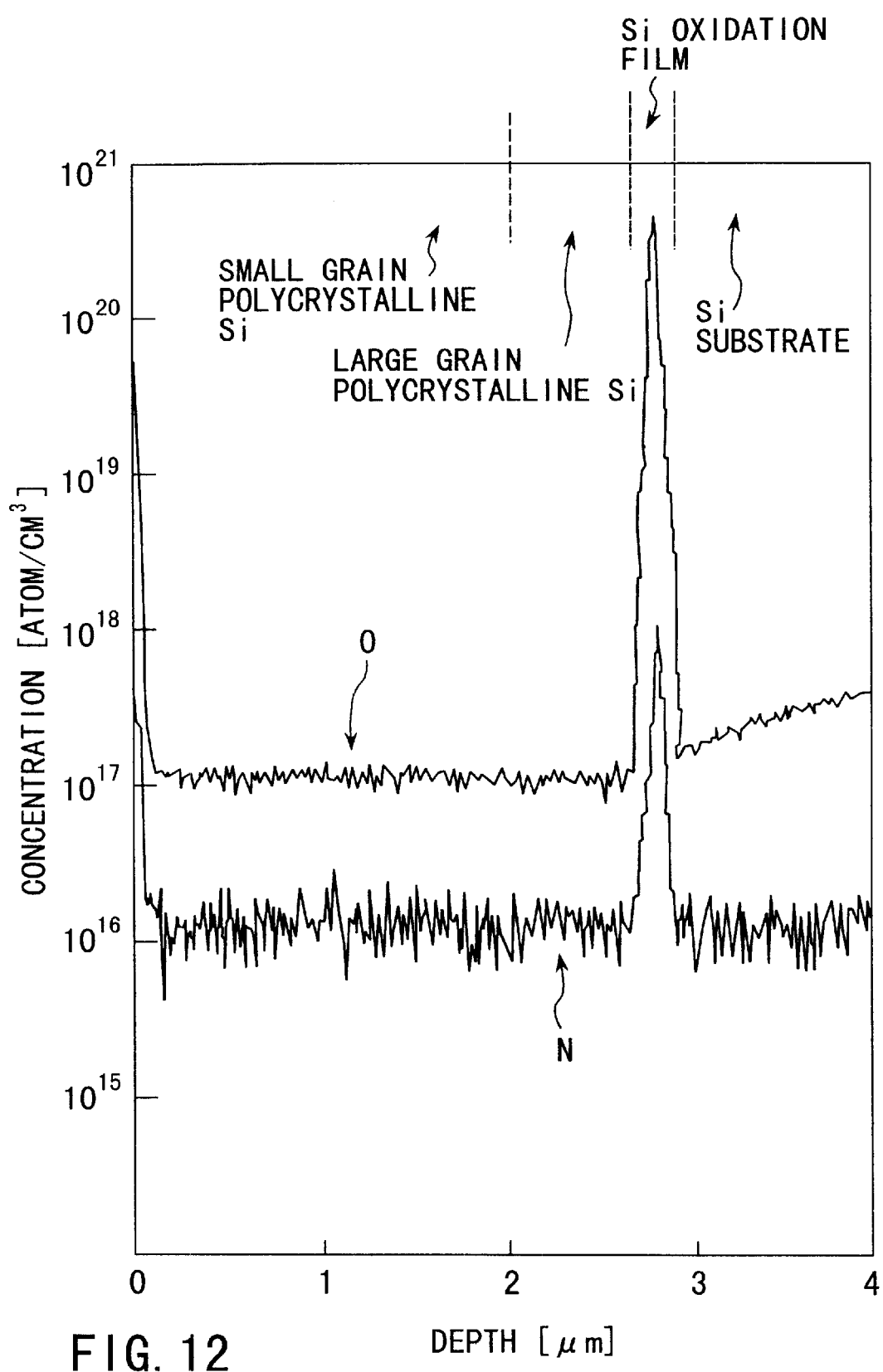
FIG. 12 is a graph showing that there are no peaks in oxygen and nitrogen in the polycrystalline silicon film.

FIG. 12 shows a distribution in concentration of oxygen and nitrogen in a film thickness direction of a polycrystalline silicon film obtained in the present invention. The concentrations of oxygen and nitrogen present in a boundary of the large-grain poly-silicon film and the small-grain polysilicon film are as low as amounts originally present in the film as a background. The peaks of oxygen concentration and nitrogen concentration are not observed at the boundary region.

The polycrystalline silicon film formed by the method of the present invention has the following characteristics.

Figure 13:
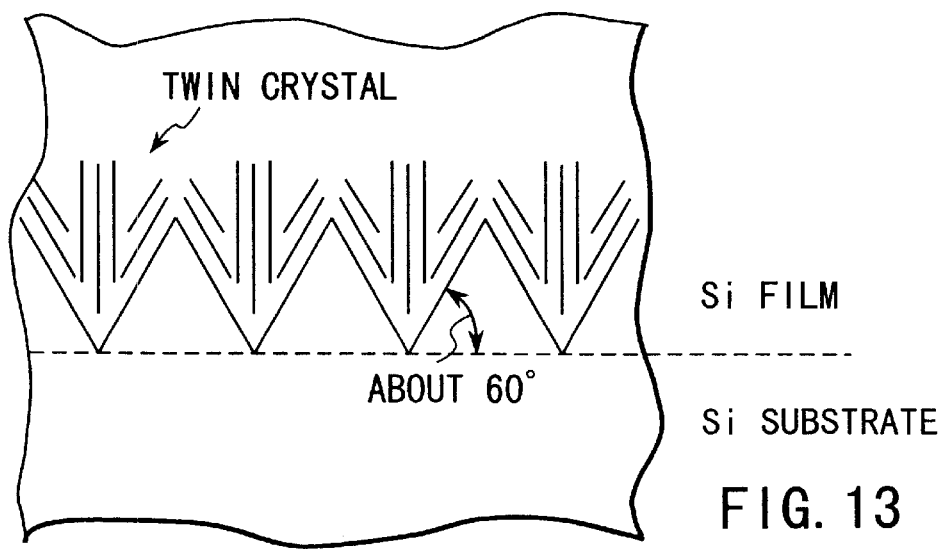
FIG. 13 is a schematic view showing a crystalline structure of the polycrystalline silicon film.

FIG. 13 is a magnified schematic view showing the portion around the interface of the TEM image of FIG. 9. There are numerous twin crystal planes in parallel to a firm-formation direction in the polycrystalline silicon film. As observed from above, it is found that the twin crystal plane grows in a [211] direction.

This is presumable as follows:

The small-grain polycrystalline silicon film is formed without the influence of the crystallinity of the underlying film under high-pressure conditions as shown in FIG. 7. In other words, the film formation is performed under a supersaturation condition of a source gas. Therefore, it is said that the higher the growth rate, more desirable the film formation.

On the other hand, it is known that the silicon film is grown at the most highest growing speed if grown in a [211] direction. Therefore, it is considered that the aforementioned crystalline state can be obtained in such a case.

If attention is drawn to the interface of the TEM observation image shown in FIG. 9, it is found that projections or depressions having an angle of about 60 degrees with the substrate surface, are formed, as shown in FIG. 13.

This is presumable that the countless number of crystals are grown in the [211] direction between the twin crystals while hitting each other, with the result that the aforementioned projections or depressions are formed.

Figure 11C:
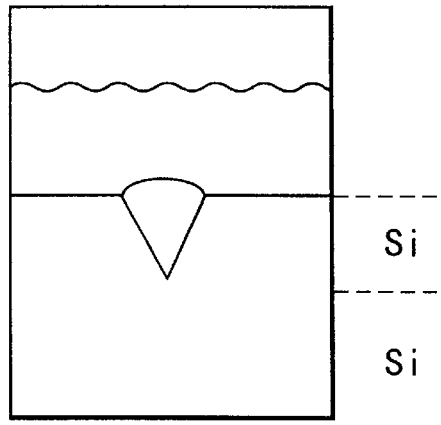

FIG. 10 shows an isolated polycrystalline grain. To facilitate understanding of FIG. 10, the profile of FIG. 10 is schematically shown in FIG. 11C.

FIG. 10 shows the surface state when the polycrystalline silicon film is deposited by controlling the film formation conditions so as to obtain a partially rough surface region (see FIG. 7). It is found that the polycrystalline grain is formed at an angle of about 60 degree with respect to the substrate surface.

As a result that the angle of the polycrystalline grains with respect to the substrate surface were measured for various regions, it was demonstrated that the angles fell within the range of 50 degrees to 75 degrees.

Note that orientation of the polycrystalline silicon film was investigated by an X-ray diffraction for the sample shown in FIG. 9, the film was found to be formed in a random orientation. It is demonstrated that the polycrystalline silicon film shown in FIG. 9 has a predominant orientation, which is different from a [110] orientation generally observed in a columnar polycrystalline silicon film.

Note that the large-grain polycrystalline silicon film was formed by recrystallizing an amorphous silicon film into a polycrystalline state in this embodiment. However, the large-grain polycrystalline silicon film may be deposited from the beginning. In this case, the large-grain polycrystalline silicon film is deposited at a lower rate than the small-grain polycrystalline silicon film.

Second Embodiment

Figure 14A:
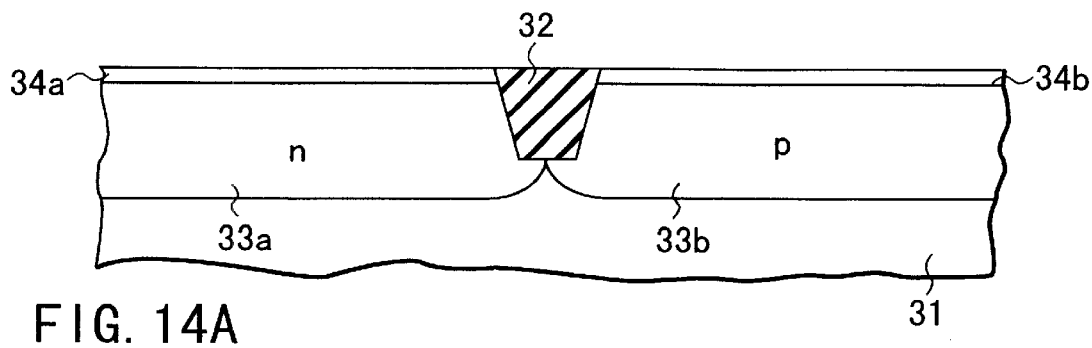
FIGS. 14A to 14E are views showing a method of manufacturing a semiconductor device having a CMOS structure according to a second embodiment of the present invention.

First, as shown in FIG. 14A, an n-well 33a, a p well 33b, and an isolation insulation film 32 are formed in a silicon substrate 31 by a well-known well formation method and isolation method (STI).

Then, as shown in FIG. 14A, channel ions are doped for adjusting a threshold voltage. $B^+$ is doped in an nMOS region under the conditions; 50 keV, $1 \times 10^{13}/cm^2$. $P^+$ is doped in a pMOS region under the conditions; 130 keV, $1.5 \times 10^{13}/cm^2$. In this manner, channel-ion doped layers 34a, 34b are formed in the surface of the silicon substrate 31 in an average concentration of $1 \times 10^{17}/cm^3$ (however, a surface concentration is $8 \times 10^{16}/cm^3$).

Figure 14B:
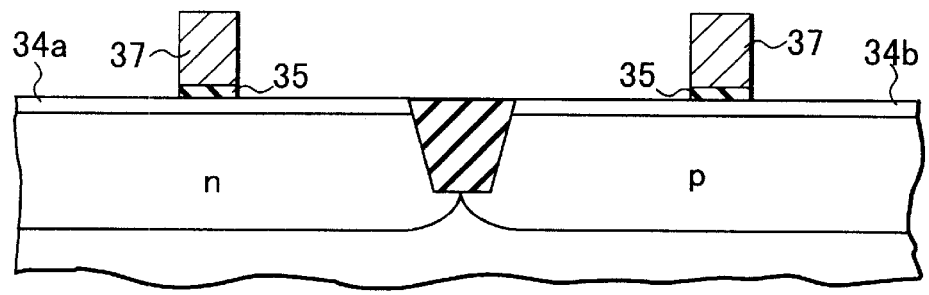
Figure 14C:
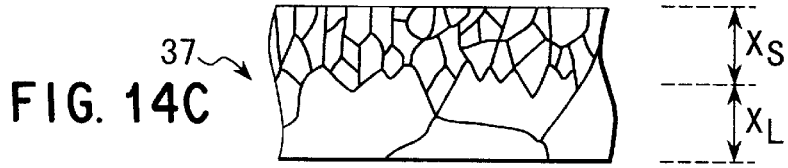

Subsequently, as shown in FIG. 14B, after an appropriate pretreatment is applied, a gate insulating film (silicon oxide film) 35 is formed in a thickness of 3 nm by a thermal oxidation method.

After the polycrystalline silicon film (about 200 nm thick) is deposited over the entire surface, the resultant structure is processed by optical lithography and anisotropic etching to form a gate electrode (polycrystalline silicon film) 37. The polycrystalline silicon film is constituted of a large grain portion, which is located near the interface with the gate insulating film 35, and a small-grain portion at the upper side. More specifically, the polycrystalline silicon film is formed by the method described in the first embodiment.

Assuming that the thickness of a portion of the large-grain polycrystalline silicon film is represented by $X_L$, the thickness of a portion of the small-grain polycrystalline silicon film by $X_S$, an average diameter of the large grain polycrystalline silicon film by $R_L$, and an average diameter of the small grain polycrystalline silicon film by $R_S$ in the gate electrode 37, there is a relationship that $X_L=X_S=100$, $R_S \leq 10$ nm, and $R_L \geq 1$ $\mu$m.

The reasons why such a relationship is obtained, will be described later.

Figure 14D:
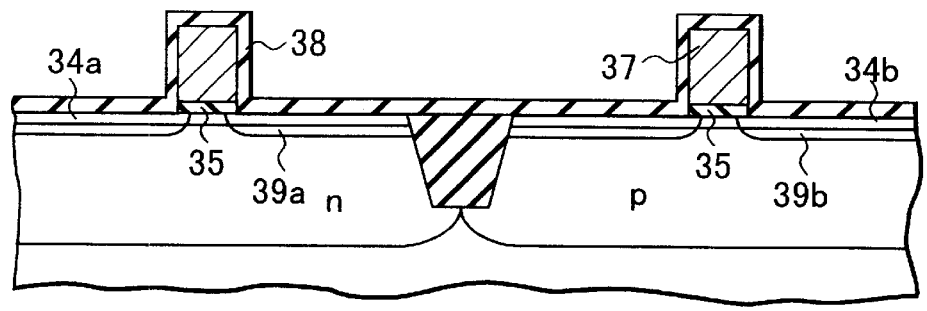

As shown in FIG. 14D, a post-oxidation film 38 (about 3 nm thick) is formed in order to prevent electric field concentration of an edge portion of the gate electrode 37.

Then, as shown in FIG. 14D, $As^+$ ions are implanted in the n-MOS region under 15 keV, $5 \times 10^{14}/cm^2$ and $BF_2^+$ ions are doped in the p-MOS region under 10 keV, $5 \times 10^{14}/cm^2$. In this way, an n-type extension region 39a and a p-type extension region 39b are formed.

Two types of impurities are doped respectively in the n-type extension region 39a and the p-type extension region 39b by using a generally-employed resist mask.

Figure 14E:
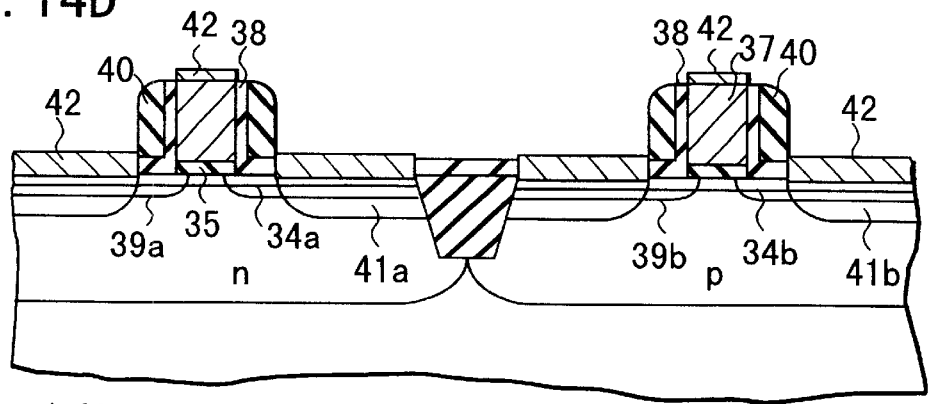

Subsequently, as shown in FIG. 14E, a silicon nitride film (about 70 nm thick) is deposited over the entire surface by a CVD method. The resultant structure is subjected to RIE etch-back. As a result, a side-wall insulating film 40 is formed on a side wall of the gate electrode 37.

As shown in FIG. 14E, $As^+$ ions are implanted in the nMOS region under conditions: 50 keV, $5 \times 10^{15}/cm^2$ to form a source/drain region 41a in the nMOS region. At this time, $As^+$ ions are implanted in the gate electrode (polycrystalline silicon film) 37 in the nMOS region. In this way, it is possible to reduce resistance of the gate electrode (polycrystalline silicon film) 37 in the nMOS region.

Then, as shown in FIG. 14E, $B^+$ ions are implanted in the pMOS region under the conditions; 7 keV, $5 \times 10^{15}/cm^2$ to form a source/drain region 41b in the pMOS region. At this time, $B^+$ ions are implanted in the gate electrode (polycrystalline silicon film) 37 in the pMOS region. In this way, it is possible to reduce the resistance of the gate electrode (polycrystalline silicon film) 37 in the pMOS region.

The acceleration voltages and dose amounts of n-type ions and p-type ions are defined in consideration of suppressing a short channel effect of the transistor and reducing contact resistance of the interface with $CoSi_2$ later formed. The aforementioned two ions may be implanted in a retrograde order.

Impurity ions introduced into the source/drain regions 41a and 41b, and the gate electrode 37 are activated by high-temperature/short time annealing treatment using RTA at 1035° C. for 10 seconds.

Note that the crystallinity of the gate electrode (polycrystalline silicon film) 37 is destroyed by the ion implantation and reactivated by the RTA treatment. Therefore, the twin crystal plane in the [211] direction (shown in the first embodiment) may be sometimes partially destroyed. The structure of the gate electrode constituted of the large-grain polycrystalline silicon film near the gate insulating film 35 and the upper small-grain polycrystalline silicon film still remain unchanged.

Then, the distribution of impurity ions in the portion close to the interface with the gate insulating film 35 was investigated by SIMS analysis after RTA.

As a result, in the source/drain region 41a of the nMOS transistor, a peak concentration was $4 \times 10^{20}/cm^3$, a peak position was 0.033 μm (depth from the surface of the silicon substrate) and the depth of the diffusion layer defined by a concentration of $2 \times 10^{17}/cm^3$ was 0.14 μm.

On the other hand, in the source/drain region 41b of the pMOS transistor, a peak concentration was $1.5 \times 10^{20}/cm^3$, a peak position was 0.027 μm (depth from the surface of the silicon substrate), and the depth of the diffusion layer having a concentration of $2 \times 10^{17}/cm^3$ was 0.19 μm.

The impurity concentrations of the gate electrode 37 of the nMOS transistor and pMOS transistor are as almost uniform as $1.5 \times 10^{20}/cm^3$.

As shown in FIG. 14E, to reduce the contact resistance, a silicide film ($CoSi_2$ film) 42 is formed in the source/drain regions 41a, 41b and the surface of the gate electrode 37. Thereafter, usually employed processes including an interlayer insulating film formation step, a metal wiring formation step, a passivation film formation step (not shown), are performed.

Now, we will describe characteristics of the CMOS transistor formed according to the aforementioned method of the present invention in comparison with those of the CMOS transistor formed in accordance with a conventional method.

Figure 15A:
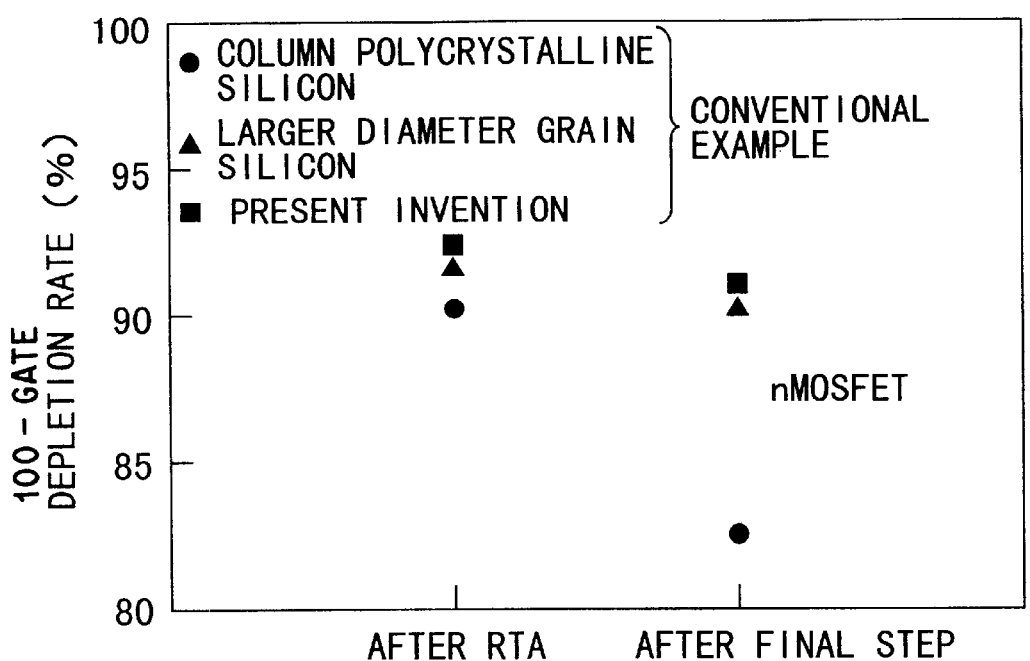
FIGS. 15A and 15B are graphs showing that 100—a gate depletion rate [%] varies depending upon difference in structure of the polycrystalline silicon film.
Figure 15B:
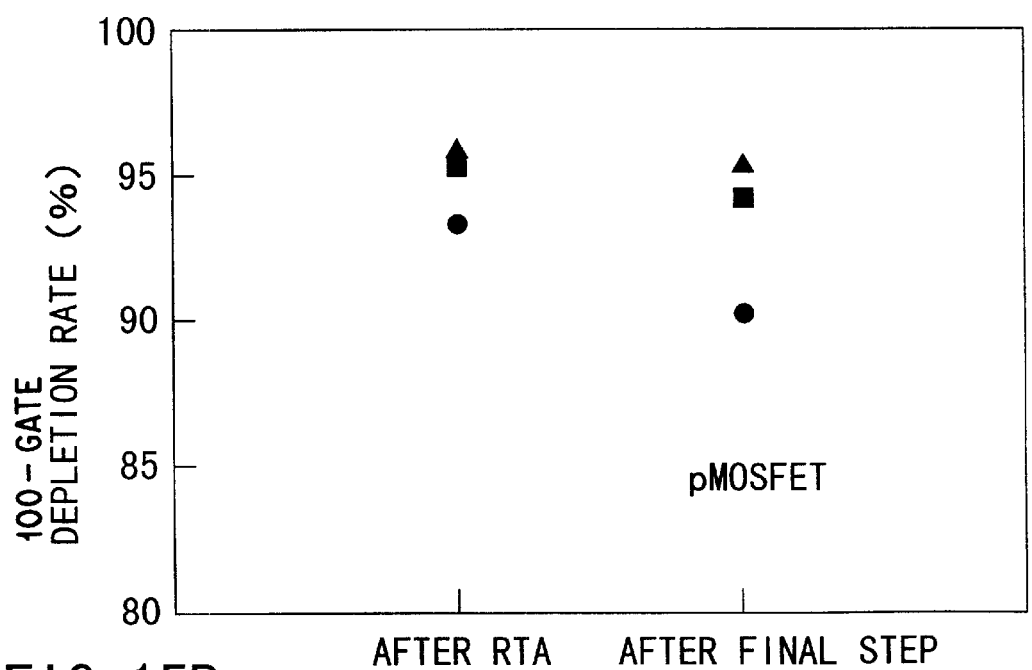

Compared to the conventional device using a columnar polycrystalline silicon film, 100—gate depletion rate [%] is improved in the device of the present invention, as is apparent from FIGS. 15A and 15B. In the following description, gate depletion rate represents 100—gate depletion rate.

In the device of the present invention, the difference in the gate depletion rate between after the RTA activation treatment and after the final step is low. More specifically, segregation/inactivation of impurity atoms to the grain boundary in the post oxidation step, which is a problem associated with the conventional device using a columnar polycrystalline silicon film as the gate electrode, is suppressed in the device of the present invention.

Figure 16:
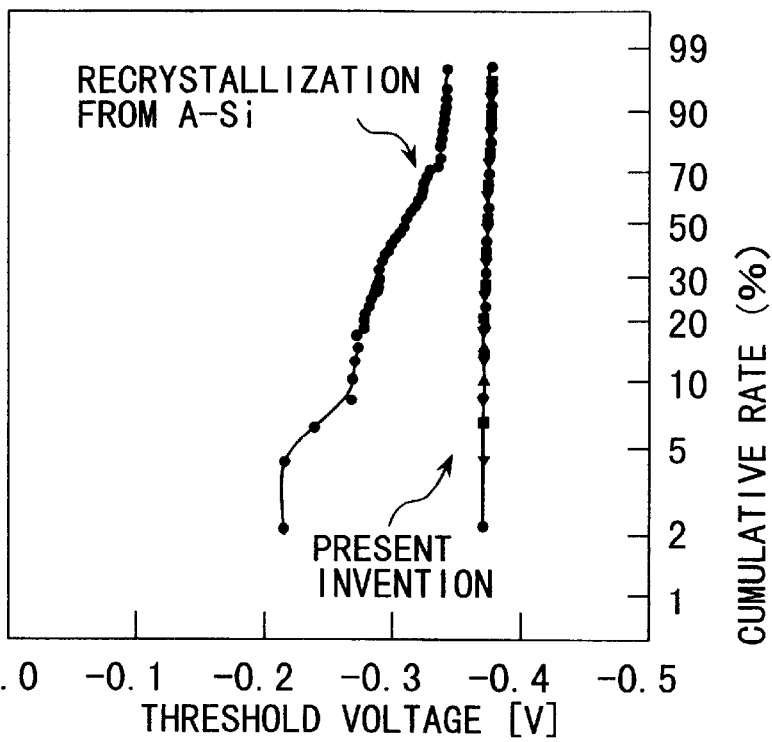
FIG. 16 is a graph showing that differences in threshold voltage variation depending upon difference in structure of the polycrystalline silicon film.

FIG. 16 shows an cumulative rate of the threshold voltage variation of the pMOS transistor having a gate length of 0.15 μm. From the graph, it is clear that variations in threshold voltage is small in the device of the present invention, compared to the conventional device (having a gate electrode using the large-grain polycrystalline silicon film recrystallized from an amorphous silicon film). The channeling is sufficiently suppressed during the ion implantation.

As described, if the present invention is applied, it is possible to improve a gate depletion rate (although it is not attained by a conventional device using a columnar polycrystalline silicon film, as the gate electrode), at the same time, to suppress the channeling during the ion implantation (although it is not attained by a conventional device using the large-diameter grain polycrystalline silicon film obtained through the recrystallization of an amorphous silicon film, as the gate electrode).

This is because the polycrystalline silicon film serving as a gate electrode is constructed such that thickness ($X_L$) of the large-diameter grain polycrystalline silicon film, the thickness ($X_S$) of the small-diameter polycrystalline silicon film, an average grain diameter ($R_L$) of the large-grain polycrystalline silicon film, and an average grain diameter ($R_S$) of the small-grain polycrystalline silicon film are set at appropriate values for simultaneously attaining an improvement of the gate depletion rate and channeling suppression. Now, how to determine these values will be described below.

Figure 17:
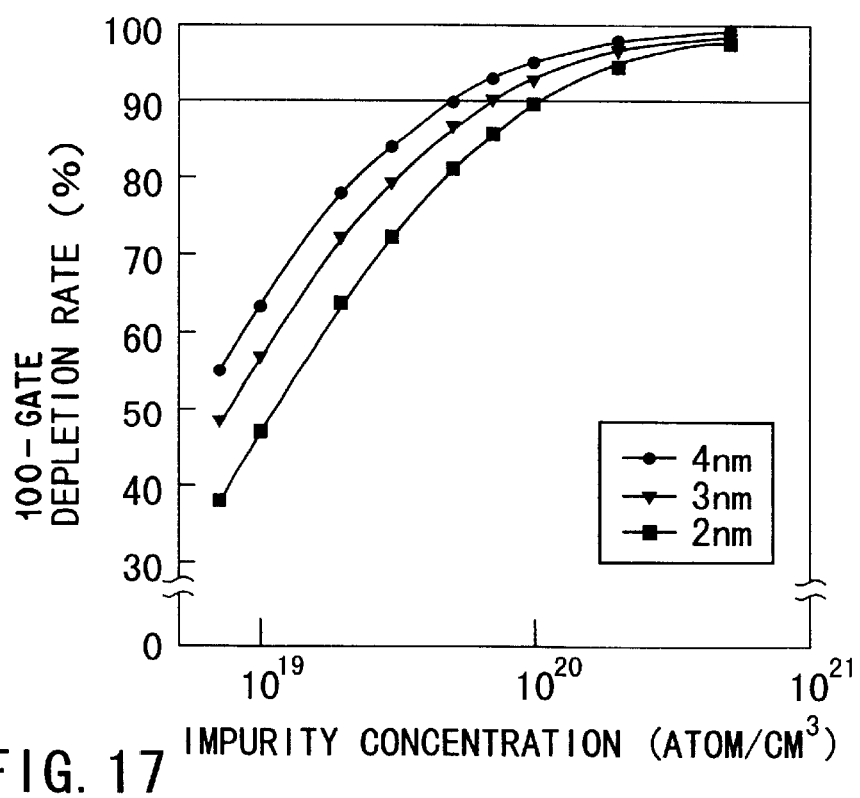
FIG. 17 is a graph showing the relationship between a concentration of electrically active impurities(activation concentration) of the polycrystalline silicon film and 100—a gate depletion rate [%]

The gate depletion rate of the gate electrode (polycrystalline silicon film) is related to the thickness $X_L$ and the average grain diameter $R_L$ of the large-diameter grain polycrystalline silicon film. As described, the gate depletion rate depends upon the electrically active impurity concentration of a polycrystalline silicon electrode near the interface with the gate oxidation film. The relationship between the gate depletion rate of the gate electrode and the concentration of the electrically active impurity in the gate electrode is investigated for three MOS transistors having gate oxidation films different in thickness (2 nm, 3 nm and 4 nm). The results are shown in FIG. 17.

In consideration of performance of the MOS transistor, the gate depletion rate must be 90% or more. To ensure this value, the concentration of the electrically active impurity must be $7 \times 10^{19}/cm^3$ or more in the case of the transistor having the gate oxidation film of 3 nm thick.

On the other hand, the concentration of the electrically active impurity of the polycrystalline silicon film is lower than the concentration of the doped impurity atoms since segregation and inactivation of the impurity atoms occur at the grain boundary. The amount of the impurity atoms segregated/inactivated is defined by the number of atoms constituting the grain boundary per unit area.

Figure 18:
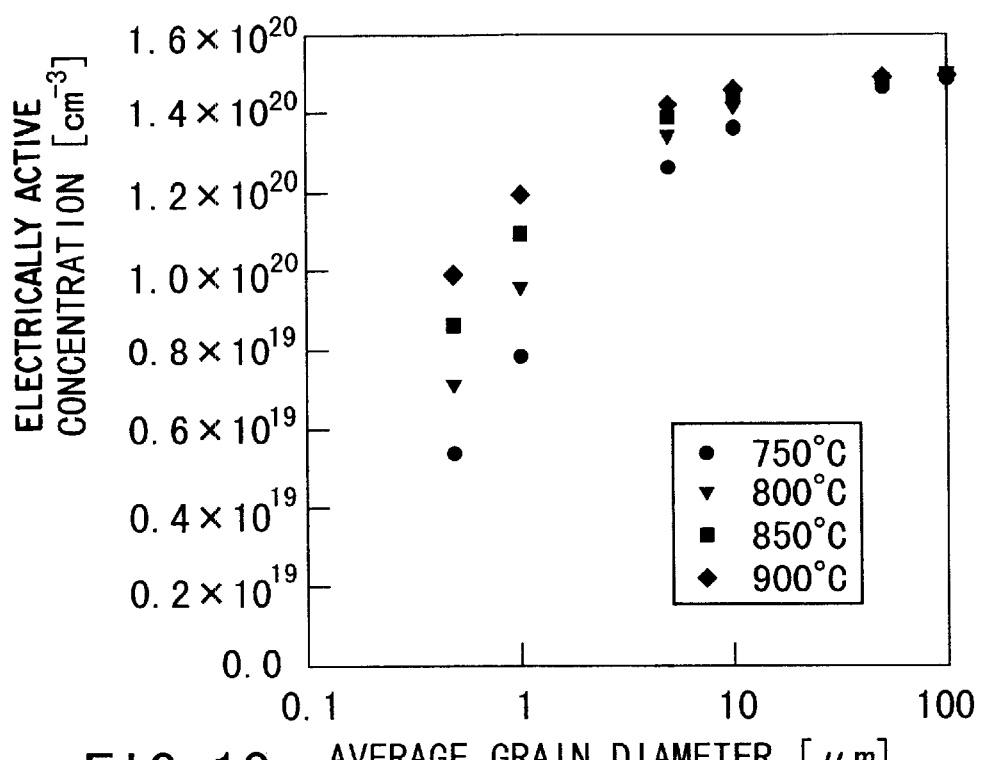
FIG. 18 is a graph showing the relationship between an average diameter of the polycrystalline silicon film and the concentration of active impurities.

The smaller the grain diameter, the more the number of atoms constituting the grain boundary. Therefore, as the grain is reduced in diameter, the segregation/inactivation easily takes place, with the result that the density of the electrically active impurity is reduced. This phenomenon is quantitatively shown in FIG. 18. The figure shows the dependence of the concentration of the electrically active impurity upon the average grain diameter (impurity is present at a level of $1.5 \times 10^{20}$ cm$^3$).

From the figure, it is found that when the average diameter is smaller than 10 μm, the concentration of the electrically active impurity decreases depending upon the average grain diameter. To attain the gate depletion rate of 90% or more (the density of the electrically active impurity is $7 \times 19^{19}/cm^3$ or more), it is found that the average diameter must be about 1 μm or more ($R_L \geq 1$ μm).

In the meantime, no matter how high the concentration of the electrically active impurity becomes, a region in which the electric field line generated between the gate electrode and silicon substrate must be terminating to a certain extent from the interface between the gate electrode and the gate oxide film as long as the polycrystalline silicon is a semiconductor.

Therefore, not only the interface between the gate electrode and the gate oxide film but also the gate electrode within the region from the interface to a certain depth, must be electrically activated.

The depth of region is electromagnetically determined and falls within the range of 0.5 to 0.6 nm. More specifically, it is necessary to form the electrically active polycrystalline silicon film within a thickness of at least 0.5 to 0.6 nm. In other words, an electrically active large-diameter polycrystalline silicon film satisfying $R_L \geq 1$ μm must be formed in a thickness of 0.5 to 0.6 nm from the interface with the gate oxide film. That is, if the margin is included, the thickness $X_L$ is required to be $\geq 1$ nm.

On the other hand, channeling suppression during the ion implantation is related to the overall thickness $X_T$ of the polycrystalline silicon film, to the thickness $X_S$ of the small-grain polycrystalline silicon film, and to an average grain diameter $R_S$ of the small grain polycrystalline silicon film.

The theoretical lowermost value of the overall thickness $X_T$ of the polycrystalline silicon film is determined by the total value obtained by adding the film thickness within which an impurity reaches on the assumption that the channeling does not take place, and the lowermost value of the film thickness $X_L$ of the large-grain polycrystalline silicon film. The distribution of the impurity is usually expressed by the LSS theoretical formula. The LSS theory is established on the assumption that channeling does not take place. As practically, ion implantation methods to an amorphous silicon film or to small-grain polycrystalline silicon film may be mentioned by LSS theory.

In the case where the channeling does not occur at all, 99% or more of the impurity is doped within a region extending from the surface to a depth of $R_P + 6\Delta R_P$ (where $R_P$ is a projection range, $\Delta R_P$ is a deviation of projection range diffusion). "$\Delta R_P$" used herein may be represented by "$R_P$" in accordance with the LSS theory. In the case of As$^+$, the heaviest impurity of usually employed ones, $R_P + 6\Delta R_P \approx 3.5 R_P$ in accordance with the LSS theory. On the other hand, since the lowermost value of $X_L$ is 1 nm as described above, $X_T \geq 3.5 R_P + 1$ nm. Since B$^+$ and P$^+$ are lighter than As$^+$, the same equation with respect to the lowermost value can be satisfied when these impurity ions are used.

On the other hand, the uppermost value of $X_T$ is not generalized unlike the case of the lowermost value but substantially determined by the controllability of the gate electrode processing. The dimensional control of the gate electrode is generally determined by the dimensional controllability of the resist serving as an etching mask and RIE anisotropy (perpendicular etching). When the perpendicular RIE is made insufficiently, even if the resist is formed in a desired size, the gate length $L_g$ does not fall within the desired range.

Figure 25:
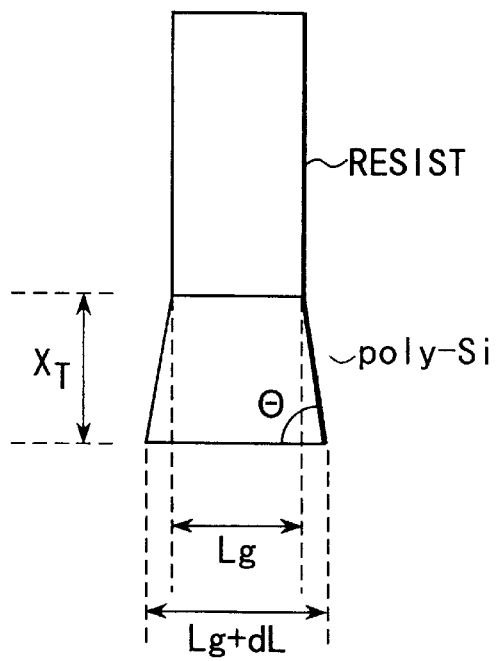
FIG. 25 is a view for explaining a dimensional change when a gate electrode is formed by processing the polycrystalline silicon film.

The amount of dimensional shift dL is expressed by a function of thickness $X_T$ of the polycrystalline silicon film, as shown in FIG. 25. Accordingly, to limit the dimensional shift dL within a certain range, the film thickness $X_T$ must be limited.

Since the gate length may be varied within the range of about 10% of the gate length, $0.1 L_g \geq 2 X_T \cdot \cos \theta$. Thus, $X_T \leq 0.1 L_g/(2 \cos \theta)$. In consideration of RIE proficiency, up to about $\theta = 88$ must be accepted. Accordingly, $X_T \leq 1.4 L_g$.

To summarize, the overall thickness $X_T$ of the polycrystalline silicon film is $3.5 R_P + 1$ nm $\leq X_T \leq 1.4 L_g$. Like this embodiment, in the case where $L_g = 0.15$ μm and an acceleration energy of B$^+$=7 keV as well as an acceleration energy of As$^+$ is 50 keV, $X_T \geq 3.5 R_P + 1$ nm=0.12 μm and $X_T \leq 0.21$ μm. In this embodiment, $X_T = 0.2$ μm, which falls within the aforementioned range.

The thickness $X_S$ of the small grain polycrystalline silicon film is considered as follows:

First of all, $X_S \leq X_T$. When the $X_T$ takes the lowermost value, $X_S = X_T - 1$ nm, as is apparent from the calculation process to the lowermost value of $X_T$. As $X_T$ is increased, $X_S$ is lowered. Therefore, if the uppermost film thickness $X_T$ is used, the lowermost value $X_S$ is determined.

Figure 20:
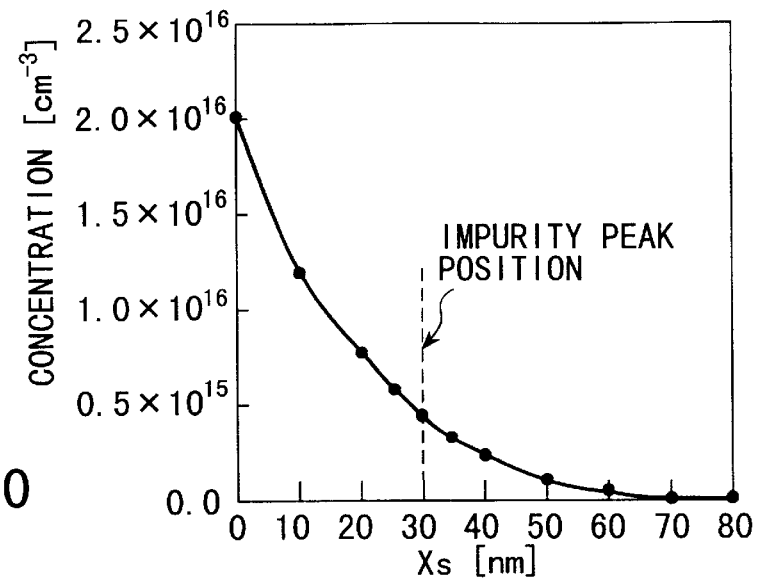
FIG. 20 is a graph showing the relationship between the film thickness of a small-grain polycrystalline silicon film and the concentration of impurity ions reaching a surface of the silicon substrate.

Now, we will explain how to determine the lowermost value of $X_S$ by taking a case of $L_g = 0.15$ μm as an example with reference to FIGS. 20 and 21.

Figure 19:
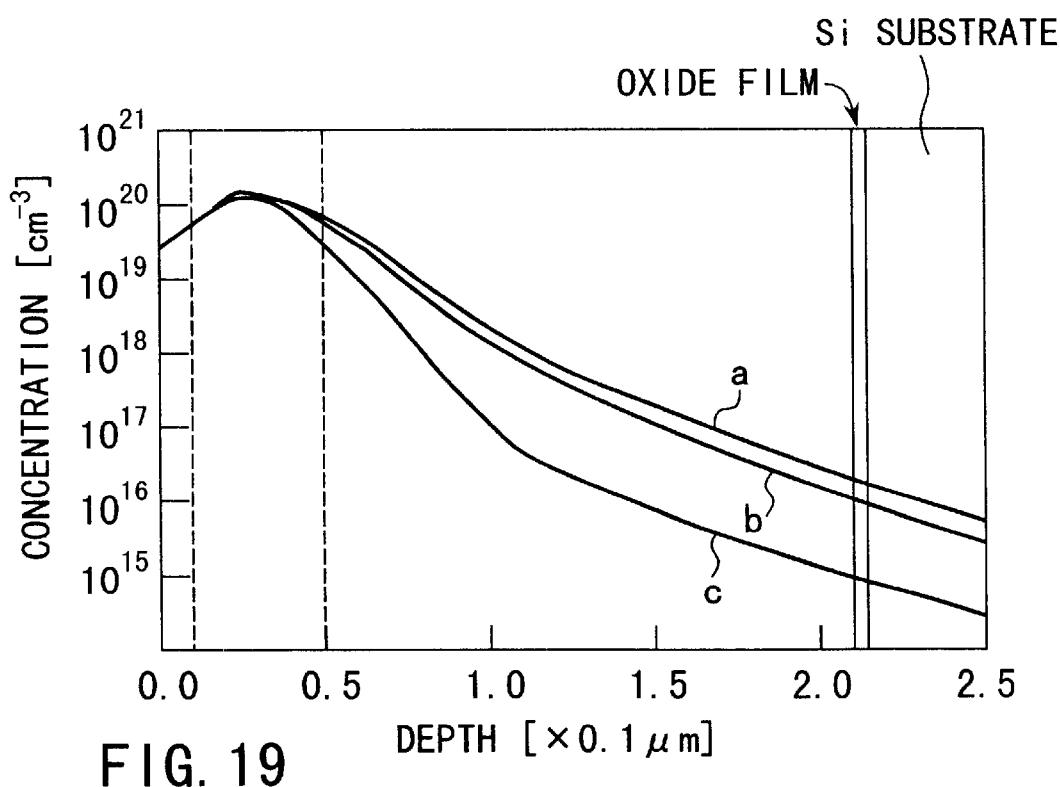
FIG. 19 is a graph showing that an impurity concentration in a depth direction varies depending upon difference in structure of the polycrystalline silicon film.

FIG. 19 shows a profile of B atoms after B$^+$ ions are implanted in the polycrystalline silicon film at an acceleration voltage of 7 keV and at a dose level of $5 \times 10^{14}/\text{cm}^2$.

Curve a shows a profile where the polycrystalline silicon film is constituted of a single crystalline structure A of the large grain polycrystalline silicon film. Curve b shows a profile where the polysilicon film is constituted of a layered-structure B of the large grain polycrystalline silicon film (film thickness: 200 nm)/small grain polycrystalline silicon film (film thickness: 10 nm). Curve c shows a profile where the polycrystalline silicon film is constituted of a layered structure C of the large polycrystalline silicon film (film thickness: 160 nm)/small grain polycrystalline silicon film (film thickness: 50 nm). Note that the small grain polycrystalline silicon film is formed on the large grain polycrystalline silicon film.

From the figure, in the case of the single crystalline structure A, an impurity is doped into the substrate at a level of about $1 \times 10^{16}/\text{cm}^3$. In the case of the layered structure C, the level of an impurity is reduced up to a level of about $1 \times 10^{15}/\text{cm}^3$. Furthermore, it was confirmed that, in the case of the single crystalline structure A, variation of threshold voltages is close to 100 mV, whereas, in the case of the stacked structure C, the variation in the threshold voltage is reduced up to about several mV.

FIG. 20 shows an concentration of an impurity which reaches the surface of the silicon substrate when the thickness of the small grain polycrystalline silicon film $X_S$ is varied while the overall film thickness of the polycrystalline silicon film is fixed at 210 nm. In this case, the thickness $X_L$ of the large grain polycrystalline silicon film is given by $X_L = 210$ nm$-X_S$.

It has been confirmed that if the amount of the impurity ions reaching to the substrate surface is about $\frac{1}{20}$ times smaller than the channel impurity concentration ($1 \times 10^{17}/\text{cm}^3$) near the substrate surface, the variation in the threshold voltage is suppressed to about several mV.

Therefore, if the small grain polycrystalline silicon film is present in a thickness equal to or deeper than the peak position of the impurity, the amount reaching the substrate surface will fall within an acceptable range.

Finally, we will describe the grain diameter $R_S$ of the small grain polycrystalline silicon film. The grain diameter of the small grain polycrystalline silicon film is defined depending upon the relationship with the gate length.

Figure 21A:
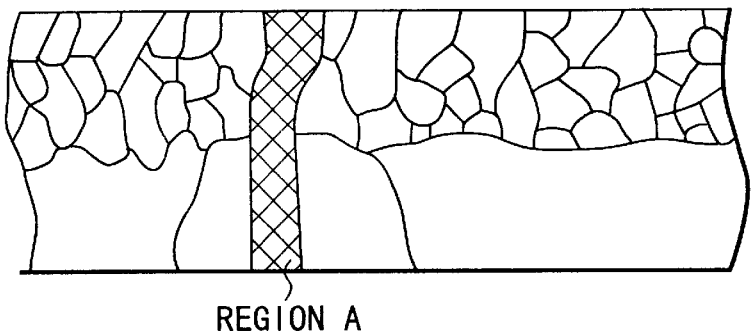
FIGS. 21A to 21C are views showing that channeling takes place when plane orientation of a large-grain polycrystalline silicon film is in parallel to that of a small-grain polycrystalline silicon film.

For example, assuming the case where an orientation of the large grain polycrystalline silicon film is in parallel with that of the small grain polycrystalline silicon film (such a case may occurs at an extremely small possibility), channeling occurs in the region A where the orientations coincide with each other, as shown in the cross-sectional view of FIG. 21A.

Figure 21B:
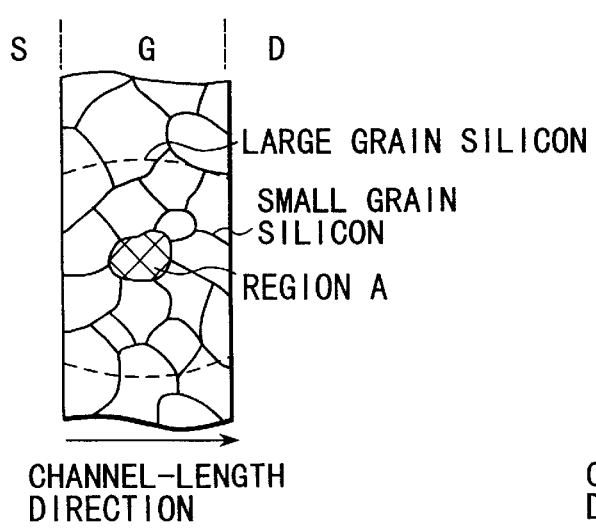

When the channeling occurs, however, if the region A is partially present along the channel length direction of the gate region G, threshold voltage does not fluctuate, as shown in FIG. 21B.

Figure 21C:
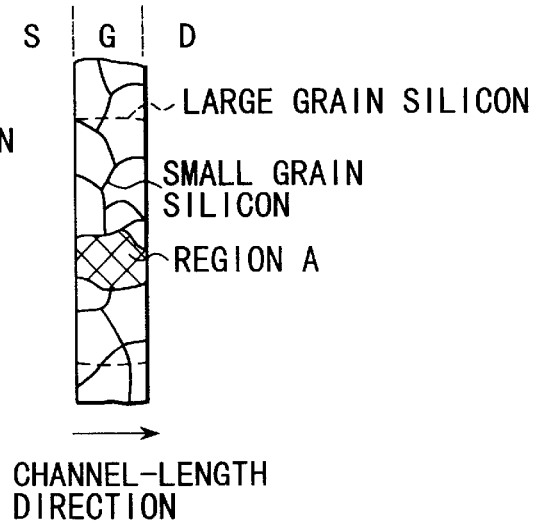
Figure 22A:
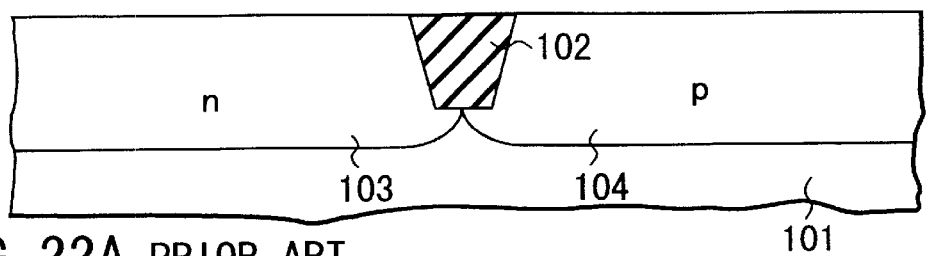
FIGS. 22A to 22E are views showing a method of manufacturing a semiconductor device having a conventional CMOS structure.
Figure 22B:
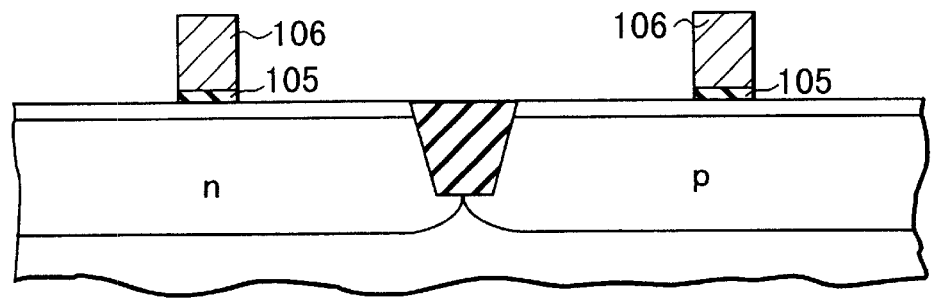
Figure 22C:
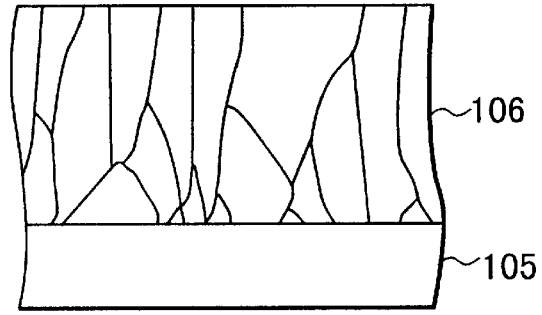
Figure 22D:
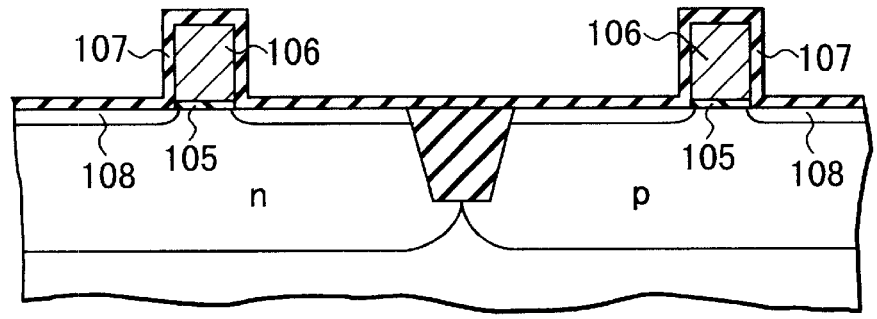
Figure 22E:
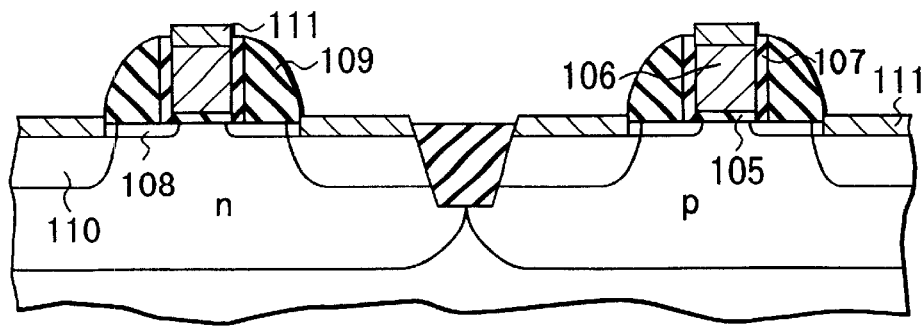
Figure 23:
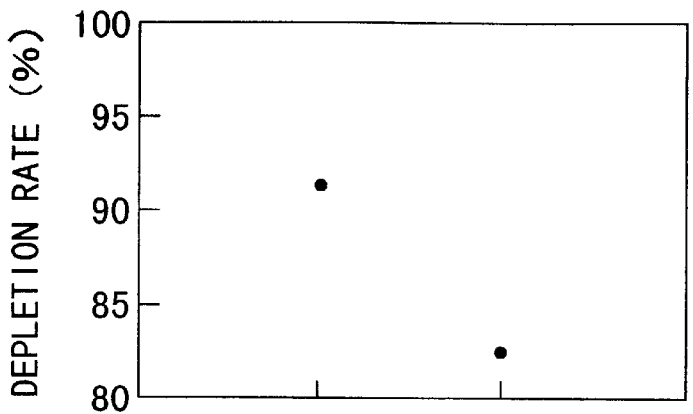
FIG. 23 is a graph showing that the gate depletion rate of the polycrystalline silicon film differs between before the deposition of the interlayer insulating film and after completion of whole steps.
Figure 24:
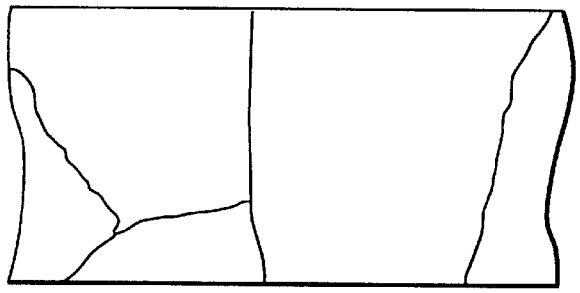
FIG. 24 is a view showing a structure of the polycrystalline silicon film formed by recrystallization of an amorphous silicon film.

However, as shown in FIG. 21C, when the region A is present over the entire gate region G along the channel length direction, the threshold voltage decreases. Thus, $R_S$ must be equal to or shorter than the gate length. $R_S$ used herein is an average diameter. However, as a matter of fact, there are grains having diameters smaller than $R_S$, $R_S$ must be set at about ⅓ or less of the gate length $L_g$, in practice.

To sum up, $$3.5\ R_P\ [nm]+1\ [nm] \leq X_T\ [nm] \leq 1.4\ L_g\ [nm]$$

$$X_T\ [nm]=X_S\ [nm]+X_L\ [nm]$$

$$X_L\ [nm] \geq 1\ [nm]$$

$$X_S\ [nm] \geq R_P\ [nm]$$

$$R_L\ [\mu m] \geq 1\ [\mu m]$$

$$R_S\ [nm] \leq (⅓)L_g\ [nm]$$

where $R_P$ is a projection range (correspond to the depth of the impurity present from the surface of the gate electrode to the peak position) of impurity ions implanted into the gate electrode. As described, impurity ions are simultaneously implanted in the same ion implantation step into the gate electrode and the source/drain regions. Therefore, $R_P$ may be also discussed by the relationship between the impurity distribution of the source/drain region and the film thickness $X_S$ of the small-grain polycrystalline silicon film.

The peak position of the impurity doped into the source/drain region does not move from the position immediately after the ion implantation, even after the whole steps are completed. Therefore, the peak position $X_P$ (S/D) of the source/drain region of MOSFET finally formed coincides with the diffusion range $R_P$. Therefore, the relationship $X_S \geq X_P$ (S/D) is established.

In the foregoing, embodiments of the present invention are explained. However, the present invention is not limited to the aforementioned embodiments and may be modified in various ways within the range of the scope of the present invention.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A MIS type semiconductor device comprising:

a semiconductor substrate;

a gate insulating film formed on the semiconductor substrate; and a gate electrode formed on the gate insulating film and formed of a polycrystalline silicon film;
wherein said polycrystalline silicon film includes a first region and a second region on the first region, an average diameter of grains contained in the first region being greater that that of grains in the second region;

an average diameter of the grains contained in the second region is 10 nm or less;

and there is no peak in oxygen concentration in a film thickness direction in the polycrystalline silicon film.

2. The MIS type semiconductor device according to claim 1, wherein the polycrystalline silicon film does not substantially contain oxygen.

3. The MIS type semiconductor device according to claim 1, wherein there is no peak in nitrogen concentration in the film thickness direction of the polycrystalline silicon film.

4. The MIS type semiconductor device according to claim 3, wherein the polycrystalline silicon film does not substantially contain nitrogen.

5. The MIS type semiconductor device according to claim 1, wherein a crystal orientation is random in an overall crystal of the polycrystalline silicon film.

6. The MIS type semiconductor device according to claim 1, wherein the polycrystalline silicon film contains impurities.

7. The MIS type semiconductor device according to claim 1, wherein the gate electrode is a gate electrode of a CMOS structure.

8. A MIS type semiconductor device comprising:

a semiconductor substrate;

a gate insulating film formed on the semiconductor substrate; and a gate electrode formed on the gate insulating film and formed of a polycrystalline silicon film,
wherein said polycrystalline silicon film includes a first region and a second region on the first region, an average diameter of grains contained in the first region being greater than that of grains in the second region;

an average diameter of the grains contained in the second region is 10 nm or less; and an interface between the first region and the second region is located at a position at least 1 nm from an interface between the gate electrode and the gate insulating film.

9. The MIS-type semiconductor device according to claim 8, wherein an impurity is doped into the polycrystalline silicon film by means of ion implantaion, the MIS-type semiconductor device satisfies the following relationship:

$$3.5\ R_P+1 \leq X_T \leq 1.4\ L_g$$

$$X_T=X_S+X_L$$

$$X_L \geq 1$$

$$X_S \geq R_P$$

$$R_L \geq 1$$

$$R_S \leq (⅓)L_g$$

where $R_P$ [nm] is an impurity projection range of ion implantation, $X_T$ [nm] is an overall thickness of the polycrystalline silicon film, $L_g$ [nm] is a size of the gate electrode along the channel length; $X_L$ [nm] is a thickness of an upper portion of the polycrystalline silicon film, $X_S$ [nm] is a thickness of a lower portion of the polycrystalline silicon film; $R_L$ [$\mu$m] is an average grain diameter of the lower portion; and $R_S$ [nm] is an average grain diameter of the upper portion.

10. The MIS-type semiconductor device according to claim 8, wherein the polycrystalline silicon film contains impurities.

11. The MIS-type semiconductor device according to claim 8, wherein the gate electrode is a gate electrode of a CMOS structure.

12. A MIS type semiconductor device comprising:
a semiconductor substrate having a main surface;
a gate insulating film formed on the main surface of the semiconductor substrate;
a gate electrode formed on the gate insulating film and formed of a polycrystalline silicon film; and
two source/drain regions, containing impurities, formed in the main surface of the semiconductor substrate so as to sandwich the gate electrode,
wherein said polycrystalline silicon film includes a first region and a second region on the first region, an average diameter of grains contained in the first region being greater than that of grains in the second region;
an average diameter of the grains contained in the second region is 10 nm or less; and
a distance between an interface between the first region and the second region and an upper surface of the polycrystalline silicon film is larger than a distance between a site at which a concentration of the impurities reaches a peak within the two source/drain regions and the main surface of the semiconductor substrate.

13. The MIS-type semiconductor device according to claim 12, wherein the polycrystalline silicon film contains impurities.

14. The MIS-type semiconductor device according to claim 12, wherein the gate electrode is a gate electrode of a CMOS structure.

* * * * *

UNITED STATES PATENT AND TRADEMARK OFFICE
CERTIFICATE OF CORRECTION

PATENT NO.    : 6,362,511 B1
DATED         : March 26, 2002
INVENTOR(S)   : Ichiro Mizushima et al.

It is certified that error appears in the above-identified patent and that said Letters Patent is hereby corrected as shown below:

<u>Title page,</u>
Item [74], in the name of the Firm, "Farbow" should read -- Farabow --.
Item [57], ABSTRACT,
Line 1, "A" should read -- a --.

<u>Column 18,</u>
Line 2, "that that" should read -- than that --.
Line 45, "implantaion" should read -- implantation --.

Signed and Sealed this

Fourth Day of June, 2002

Attest:

JAMES E. ROGAN
*Attesting Officer*    *Director of the United States Patent and Trademark Office*